United States Patent [19]

Swengel, Sr. et al.

[11] 3,969,816

[45] July 20, 1976

[54] BONDED WIRE INTERCONNECTION SYSTEM

[75] Inventors: Robert Charles Swengel, Sr., York; Timothy Allen Lemke; Frederick Phillip Villiard, both of Mechanicsburg, all of Pa.

[73] Assignee: AMP Incorporated, Harrisburg, Pa.

[22] Filed: Jan. 6, 1975

[21] Appl. No.: 538,663

Related U.S. Application Data

[60] Division of Ser. No. 314,062, Dec. 11, 1972, Pat. No. 3,872,236, which is a continuation-in-part of Ser. No. 152,140, June 11, 1971, abandoned.

[52] U.S. Cl. .................................. 29/625; 29/627; 317/101 B; 350/96 B; 174/68.5
[51] Int. Cl.² .................................................. H05K 3/20
[58] Field of Search ............. 29/624, 625, 626, 627, 29/203 MW, 203 J, 593; 317/101 B, 101 C, 101 CE, 101 CM, 101 CC, 122; 350/96; 40/130 K, 130 L; 340/380; 333/95 R; 174/68.5; 324/51

[56] References Cited
UNITED STATES PATENTS

| | | | |
|---|---|---|---|
| 3,436,604 | 4/1969 | Hyltin et al. | 317/101 CC X |
| 3,659,340 | 5/1972 | Giedd et al. | 174/68.5 X |
| 3,674,914 | 7/1972 | Burr | 350/96 R |
| 3,711,626 | 1/1973 | Kilby et al. | 174/68.5 X |
| 3,747,209 | 7/1973 | Chow | 29/628 X |
| 3,777,154 | 12/1973 | Lindsey | 350/96 R |

*Primary Examiner*—Milton S. Mehr
*Assistant Examiner*—Dan C. Crane
*Attorney, Agent, or Firm*—Gerald K. Kita

[57] ABSTRACT

An interconnection system suitable for transmission lines, in the form of electrical or optical conductors, or in the form of conduits for electrical waveguide transmission, reflected light or fluidic signals, wherein lengths of such transmission lines bridge between discrete point-to-point location on a substrate, the transmission lines being anchored by sealant and filler material at selected substrate locations and being cut generally transversely, or otherwise transversely formed, to provide exposed conductor or conduit end portions anchored at the selected locations. The transverse areas of the conductors or conduits defined by such transversely cut, or otherwise transversely formed, and exposed end portions provide energizable signal energy planes. More specifically, such discrete energizable planes in the form of transverse conductor surfaces, are of a size and shape conforming to the transverse conductor areas exposed by cutting or other forming operation. Such conductors may be either insulated electrical or optical conductors provided thereover with metal or a metallized coating to result in an electrical shielded, or an optically shielded and reflecting, interconnection system. The transmission lines in the form of conduits provide discrete, end-anchored conduits for conveying signal energy excitations in the form of fluidic pressure, reflected optical energy or electrical waveguide transmissions. The ends of the conduits are anchored in the substrate and define generally transverse end openings of the conduits. The transverse areas of such openings provide energizable signal energy planes through which the conveyed signal excitations are transmitted. The size and shape of the energizable signal energy planes conform to the conduit transverse end areas exposed by cutting.

14 Claims, 47 Drawing Figures

OPTICAL OR ELECTRICAL CONDUCTORS

OPTICAL OR ELECTRICAL CONDUCTORS

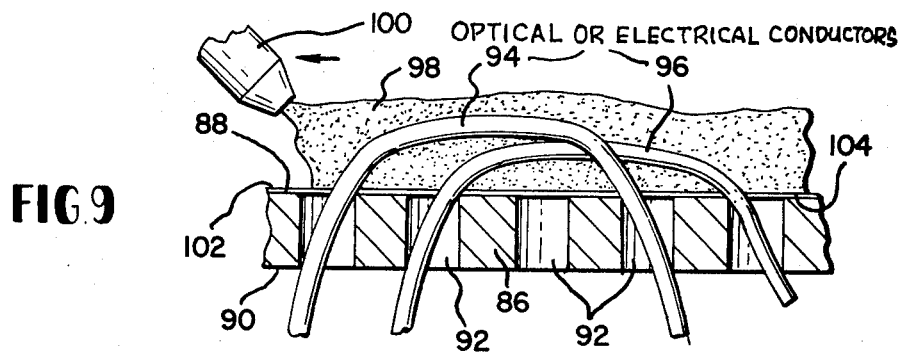
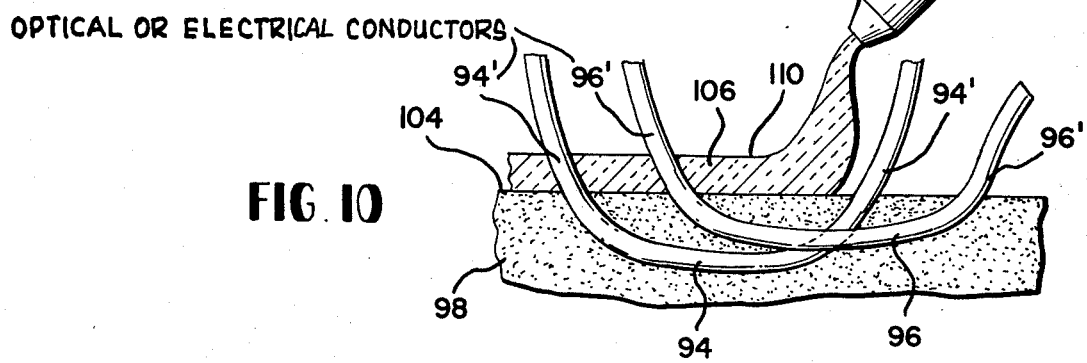
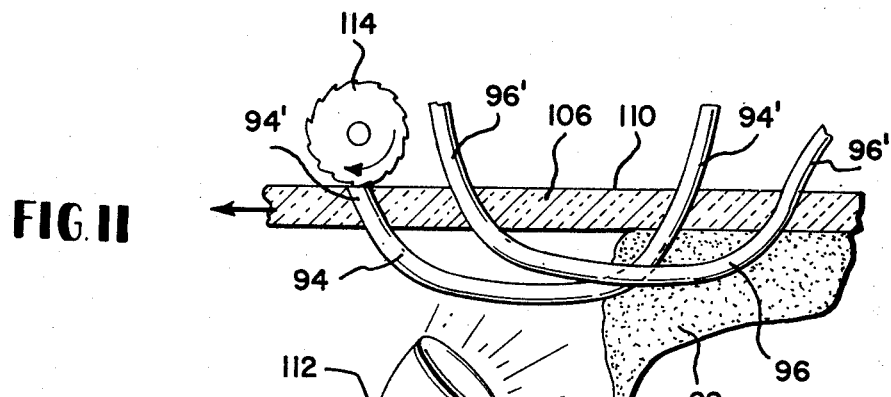
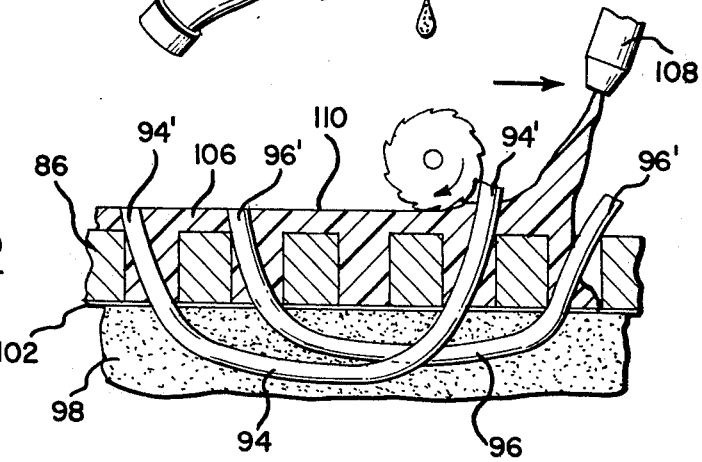

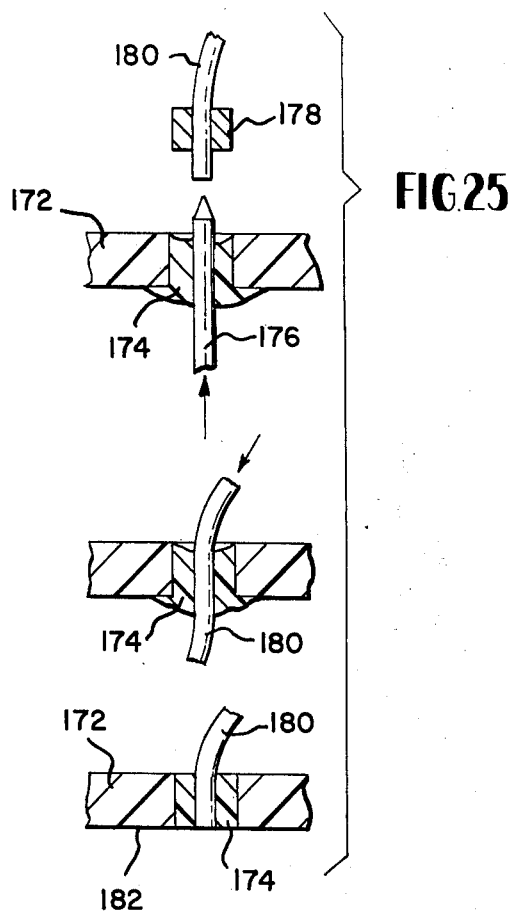
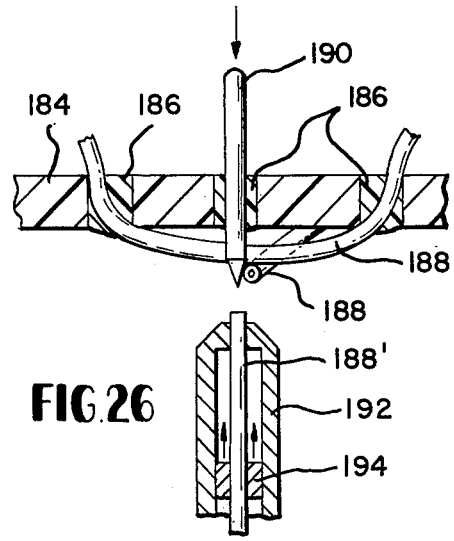
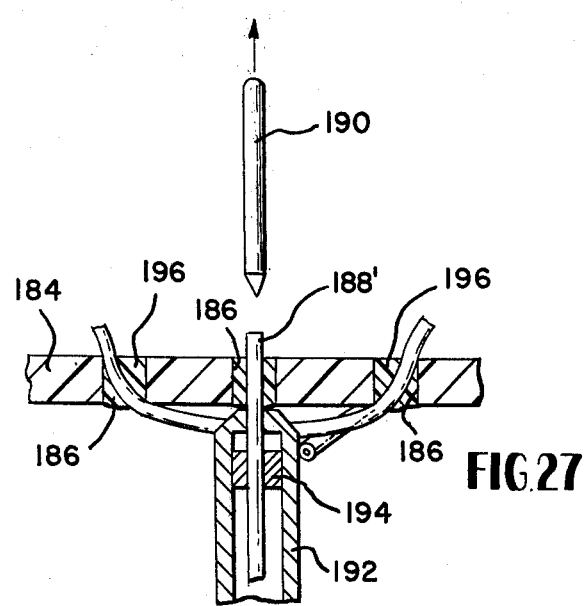

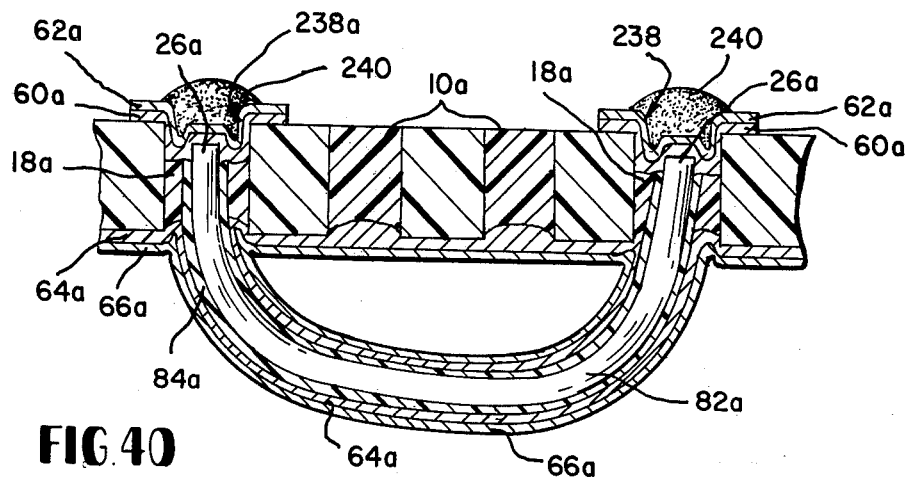
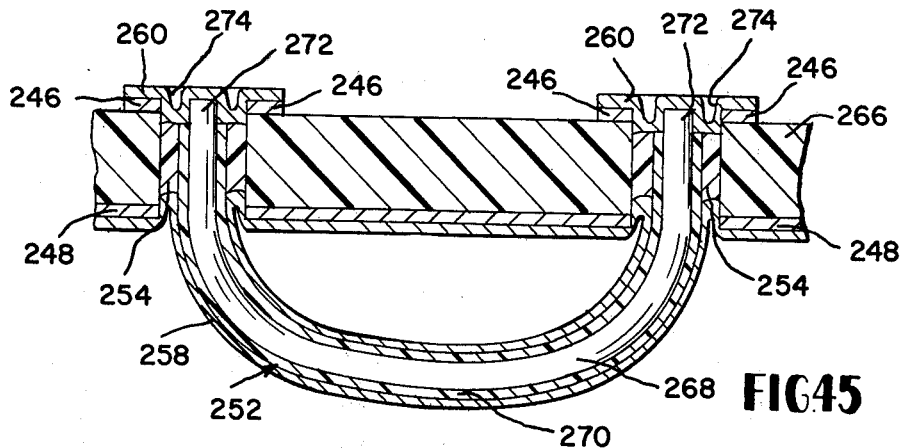
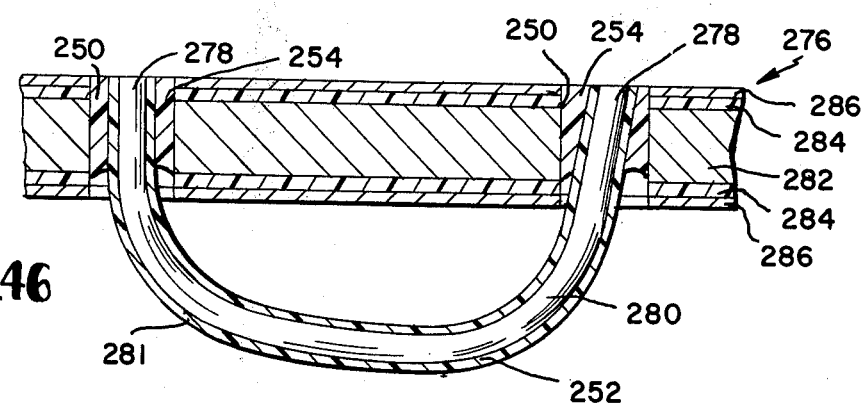

BONDED WIRE INTERCONNECTION SYSTEM

CROSS REFERENCE TO RELATED APPLICATION

This is a division of application Ser. No. 314,062, filed 12/11/72, now U.S. Pat. No. 3,872,236, which is a continuation-in-part application of Ser. No. 152,140, filed June 11, 1971 and now abandoned.

The present invention relates to a system of point-to-point transmission line interconnection, and more specifically to a point-to-point, conductor or conduit interconnection system and method of fabrication thereof, the system being suitable for miniaturization and automatic assembly resulting in either a shielded or an unshielded transmission line network.

BACKGROUND OF THE PRIOR ART

The present invention has been developed in response to a long existing need for packaging high density optical, fluidic or electronic equipment, and further, in response to the need for an interconnection technique suitable for miniaturization, automatic assembly and acceptance of either shielded or unshielded transmission lines in a network suitable for conveying information in the form of high frequency components.

The increased requirement for miniaturization, when coupled with the complexity of circuitry employing very high frequency components and systems, provides a challenging requirement for a new technique of circuit interconnection enabling completion of a sophisticated electronic system within a smallest possible package. The trend in integrated circuits toward creation of multi-function chips results in an ever increasing availability of new chips which greatly increases the number of required interconnections in a wiring network or package, and which necessitates quickly and easily accomplished changes in existing packages for acceptance of the newly available chips.

Increased signal frequencies and rates of information transfer, and decreased circuit noise tolerance have necessitated a revision in interconnection requirements. For the circuit standpoint, the interconnection lines must reduce propagation time delay, and keep at acceptable levels generated electrical reflections, cross talk signals, common ground return path signals and signal attenuation. False signals or noise, and signal attenuation levels are reduced by control of characteristic impedance and shielding of the transmission lines. Propagation delay is reduced by use of minimum transmission line lengths. However, as the need for low amplitude-short rise time signals increases, there results an increasing network sensitivity to noise and transmission losses. Thus the trend toward miniaturization, high speed and higher density, results in diminishing available space for interconnections coupled with an increased number of interconnections with reduced sensitivity to interference and signal attenuation.

Another of the problems encountered in design of an interconnection system, is the capability of performing engineering changes. The trend in integrated circuits toward multi-function circuits per chip, as well as advancing technology in multi-function circuitry fabrication, often requires total redesign of a package to accept improved and newly available chips and to eliminate obsoleted chips. A desirable interconnection system thereby should be easily adapted for change, either without considerable redesign, or with complete replacement with an interconnection system which is easy to design and fabricate at low cost.

In an attempt to meet the requirements of miniaturized interconnection systems, considerable effort has been expended in the prior art toward termination of discrete coaxial cables. Heretofore, such efforts have produced insufficient results, especially in adapting packaging techniques for automation and low cost in both network design and fabrication.

According to another prior art packaging technique, the leads of a microelectronic component are received in the apertures of a prepunched terminal board. The apertures receiving the leads also contain insulation covered wiring threaded up through the apertures. The wiring is also threaded down through adjacent apertures of the board to provide a laced function and appearance. Soldering of the laced wires to the leads is done directly through the wire insulation, the molten solder melting the wire insulation, generally wicking into and filling the holes, and electrically bonding the wiring to the leads. This technique is disadvantageous since all the wiring and solder bonding must be done by hand. Great care must be undertaken to prevent solder leakage paths on other wiring or on other surfaces of the substrate. It is also difficult to change circuitry, since such would involve drilling out or reflowing the solder connections, with the result that the solder is either particulated and scattered, or is reduced to a molten state for flowing into undesired apertures or on other surfaces of the terminal board, causing contamination and electrical shorting of the unchanged circuitry. In addition, the system is not suited for shielded wire interconnections because the solder bonded to the microelectronic component leads in selected apertures would create leakage paths to the shielded portions of the wire.

According to another prior art technique, insulated wiring is adhesively bonded to a substrate surface, the wiring forming a criss-cross matrix of discrete electrical paths. Holes are drilled in the substrate at selected locations to expose the wiring conductors. The holes are then plated or otherwise lined with a conducting material, thereby providing electrical sockets, in contact with the wiring conductors and for receiving the leads of microelectronic components. This packaging technique requires considerable expenditures of time because of the need for separately drilling and electrically connecting each socket. In addition, this system cannot be adapted for shielded wiring, since the drilling and plating operations would create electrical shorting paths to the shielding provided on the wiring. Since the matrix of wiring is adhesively bonded to the substrate, and since discrete paths of wiring overlie one another on the matrix surface, changes in point-to-point interconnections is difficult. To change the network, the wiring connected to the sockets must be severed and then patched with an additional length of wiring, followed by covering the patched portions with insulation. Such operation changes the characteristic impedance of the circuit paths.

Another interconnection technique has resulted in a multi-layer printed circuit, wherein several layers of deposited copper conductors result in increased density. However, a requirement for precision, in masking, in registration between layers, in hole drilling and interconnection between layers, requires a large investment in automated production machinery. In addition, computer usage is required for even the most basic network design, as well as for the choice of layers and point-to-point destinations for each conductor. Since deposited conductors are used, the system is not well suited for fabrication of precisely controlled characteristic impedance conductors. In addition, an entire circuit must be redesigned to accommodate the smallest circuitry change. Another major drawback of such a packaging technique results from the need to build completely the multilayer package before testing it for deficiencies in cross talk, attenuation, reflection noise and common ground return path noise. Should such deficiencies in performance occur, a complete redesign of the package is required.

BRIEF DESCRIPTION OF THE PREFERRED EMBODIMENTS

The present invention comprises an interconnection system, and a method for fabrication thereof, developed in response to the long existing needs in the prior art. The present invention system and method of fabrication eliminates deficiencies in the prior art interconnection systems. According to the invention, lengths of conductor strands or other conduit-forming strands are bridged between discrete point-to-point locations determined by a matrix-apertured substrate. The strand lengths are anchored within the substrate apertures by non-signal-permeable filler material within the apertures, which material is rigidized or otherwise solidified to sealably encircle the strands. The solidified material thus becomes at least part of the substrate thickness. The strand lengths are cut or otherwise formed with generally transverse strand and areas at selected aperture locations to provide transversely cut or otherwise transversely formed end portions of the strands which are located generally adjacent to the substrate surface and anchored in the substrate apertures by the filler material. If the strands are insulated electrical conductors, the transverse end surfaces of the conductors, which are exposed by cutting, for example, provide anchored, discrete electrical contact surfaces to which may be attached microelectronic component leads or, alternatively, metallized electrical pads. The bridging lengths of the insulated wiring provide fixed conductors which may be metallized to provide specific impedance, shielded coaxial cables. The wiring is metallized by plating, or by coating the wires with metallizing films, or by encapsulating the wires in metal or a metallized encapsulant. The anchoring filler material provides encircling seals around the exposed transverse conductor surfaces to prevent shorting of the metallized shielding to either the conductors or any pads thereon. The interconnection system according to the present invention is also well suited for interconnections and use. In addition to using insulated electrical conductors, lengths of optical conductors may be bridged from point-to-point. The ends of the optical conductors may be anchored in the apertures by the filler material and then transversely cut or otherwise formed with transverse end areas as described. Metallizing of the optical conductor lengths may be eliminated, but if utilized, such metallizing provides reflective metal barriers encircling the optical conductors for reducing optical signal loss or attenuation and optical cross talk.

According to another variation, the transmission lines may also be in the form of conduits for reflective optical, fluidic or electrical waveguide transmission. To adapt the interconnection system for conduits, the transmission lines are fabricated by lengths of strand material. The strands are anchored in the non-signal-permeable filler material, which is rigidized or solidified to form at least a part of the substrate thickness. The strands are then metallized as described above. The metallized strands are then encapsulated in a castable or moldable, subsequently rigidized or solidified material such as a thermosetting plastic. This renders the metallized strand lengths in rigid fixed positions. The strand lengths are then suitably removed from their surrounding metallizing material, leaving the metallizing material in tubular conduit configurations encapsulated in plastic. The inner surfaces of the conduits will conform to the cross section shape of the removed strands, and their inner dimensions may be accurately controlled to reduce fluidic, optical or electronic wave signal attenuation. The metallizing material may be reflective or enhance transmission of optical signal energy through the conduits. The metallizing process may be carefully controlled to form the conduit ends with a desired transverse configuration that can be flush with the substrate surface, or a grinding or other cutting operation may be used to form the ends of the conduits in desired transverse end area configurations, suitably providing the desired transverse energizable signal energy planes.

The invention thus relates to an interconnection system suitable for transmission lines, in the form of electrical or optical conductors, or in the form of conduits for waveguide transmission, reflected light or fluidic signals wherein lengths of such transmission lines bridge between discrete point-to-point locations on a substrate, the transmission lines being anchored by sealant filler material at selected substrate locations and being cut generally transversely, or otherwise formed, to provide exposed conductor or conduit end portions anchored at the selected locations. The transverse areas of the conductors or conduits defined by such transversely cut or otherwise transversely formed and exposed end portions provide energizable signal energy planes. More specifically, such discrete energizable planes in the form of transverse conductor surfaces, are of a size and shape conforming to the transverse conductor areas exposed by cutting. Such conductors may be either insulated electrical or optical conductors provided thereover with metal or a metallized coating to result in an electrically shielded, or an optically shielded and reflecting, interconnection system. The transmission lines in the form of conduits provide discrete, end-anchored conduits for conveying signal energy excitations in the form of fluidic pressure, reflected optical energy or waveguide transmissions. The ends of the conduits are anchored in the substrate and define generally transverse and openings of the conduits. The transverse areas of such openings provide energizable signal energy planes through which the conveyed signal excitations are transmitted. The size and shape of the energizable signal energy planes conform to the conduit transverse end areas exposed by cutting.

The interconnection system according to the present invention is well suited for automation in design and fabrication. The conductor or strand lengths may be inserted by hand or by automatic machine directly from point-to-point locations, thereby eliminating the need for an orthogonal X-Y system, and further minimizing the transmission line lengths from point-to-point. The resultant transmission line transverse ends, may be simultaneously formed by carefully controlled metallizing or by a mass grinding or other cutting operation, for example, without a need for separately treating each transmission line for a desired discrete transverse energizable signal plane. Changes in circuitry design are readily accomplished merely by subsequent addition of transmission line lengths from point-to-point, and anchoring such lengths in place by added filler material. Additionally, individual transmission line lengths may be removed by drilling out the filler material which anchors the ends of the selected lengths. The drilling operation results in new apertures, for acceptance of new transmission lines, or to receive additional filler material for filling and sealing. By using transmission lines of controlled diameters, the impedance thereof are readily controlled, and a lower loss interconnection system can be obtained. Time delay in the system can be reduced merely by minimizing the lengths of transmission lines utilized from point-to-point.

This invention also relates to interconnection systems, and more particularly to an interconnection system using a conductor having a layer of insulation bonded thereto.

Naturally, the reliability of an interconnection system of the type described above is an extremely important commercial consideration. Reliability is determined essentially by structural integrity and electrical continuity in all established point-to-point interconnections. However checking electrical continuity and testing for structural integrity has always been a major problem in miniaturized interconnection systems, wherein hundreds or thousands of separate point-to-point interconnections are made in extremely confined areas. In the past it has often been necessary to conduct individual tests to check the continuity of each point-to-point connection in an interconnection system of the type described above. However a problem occasionally arises in the basic assumption upon which the continuity checking theory is based. More particularly, the interconnection system described in the above referenced copending application relies upon the insertion of transmission line segments into apertures in a substrate and affixing the transmission line segments in place. Discrete energizable signal energy planes are then formed at one surface of the substrate, and provide the junctions at which electrical components are coupled to the interconnection system. The usual continuity checking technique relies upon the basic assumption that any discontinuity in a particular point-to-point interconnection will occur at or near the surface of the substrate, and will not occur in the transmission line segment connecting two separate points. Although this assumption is accurate in most cases, a need exists for further improving the reliability of this assumption, and thereby further improving the reliability of the continuity checking technique.

Furthermore, additional problems arise in assembling circuit boards according to the interconnection system described in the above referenced copending application, particularly where segments of insulated wire are used. In this regard it is pointed out that, although the interconnection system described in the above referenced copending application is very general, and permits the use of optical, fluidic and other types of transmission lines in addition to electrical transmission lines, in many of the most practical and currently commercially important environments, transmission lines comprised of insulated wire are preferably used. Insulated wire in itself causes certain problems since, in the fine gauge wires normally used, the insulation is generally not attached to the wire it surrounds. Thus the insulation of a particular transmission line segment may stretch so that it overlaps the end portions of the conductive wire, or the wire may slip with respect to its insulation prior to or subsequent to installation in a circuit or interconnection board. The latter phenomenon is particularly true in the environment of the interconnection system described in the above referenced copending application since, as each insulated wire transmission line segment is mounted into a substrate or board structure, the insulation is alone cemented to the board, thereby permitting the wire segment within the insulation to move relative to the insulation. This can cause numerous problems and circuit discontinuities. However even where the discontinuities can be detected, the boards showing such discontinuities must be rejected as defective, thereby rendering the manufacturing technique less effective and more costly.

Briefly, the invention further resides in an interconnection system wherein an improved insulated wire is used to interconnect discrete point-to-point locations. The improved insulated wire includes insulation that is bonded at all points to a central conductor. Thus the improved wire prevents slippage between the enclosed conductor and its surrounding insulation, and further prevents stretching of the insulation independent of the central conductor. The wire and insulation, which are bonded together at all points thus serve to structurally reinforce one another, thereby greatly improving the strength of each transmission line segment. Furthermore elimination of the possibility of slippage between a central conductor and its surrounding insulation greatly reduces the likelihood of discontinuities occurring near the surface of a board or substrate, thereby improving the overall reliability of each manufactured unit.

It is therefore an object of the present invention to provide an interconnection system suitable for transmission lines, in the form of optical or electrical conductors, or in the form of conduits for electrical waveguide transmission, reflected light or fluidic signals.

Another object of the present invention is to provide a transmission line interconnection system suitable for miniaturization and automation in design and assembly.

Still another object of the present invention is to provide an interconnection system suitable for transmission lines, in the form of electrical or optical conductors, or in the form of conduits for waveguide transmission, reflected light or fluidic signals, wherein lengths of such transmission lines are anchored in a substrate and bridge between discrete point-to-point locations on the substrate.

Yet another object of the present invention is to provide an interconnection system suitable for transmission lines, in the form of conductors or conduits, wherein lengths of such transmission lines bridge between discrete point-to-point locations on a substrate, with the transmission lines being anchored by sealant and filler material at selected substrate locations.

Another object of the present invention is to provide an interconnection system for conductor or conduit transmission lines anchored between discrete point-to-point locations on a substrate by a sealant and filler material, with the ends of the transmission lines being transversely formed to provide exposed conductor or conduit end areas in the form of energizable signal energy planes.

It is yet another object of the present invention to provide an interconnection system for shielded electrical or optical conductors, with the ends of the conductors anchored by a sealant and filler material at discrete point-to-point locations on a substrate, and with the transverse end areas of the conductors providing transverse energizable signal energy planes.

Another object of the present invention is to provide a method of fabricating a system of point-to-point transmission line interconnection suitable for conductor or conduit transmission lines and suitable for miniaturization and automatic assembly to result in either a shielded or an unshielded transmission line network.

Still another object of the present invention is to provide a point-to-point, conductor or conduit interconnection system and method of fabrication thereof, the system being suitable for miniaturization and automatic assembly resulting in either a shielded or an unshielded transmission line network.

Another object is to provide an interconnection system with wires bonded to its insulation to enable etching or other operations without contaminants entering the conductors of the interconnection system.

Another object of the present invention is to provide a transmission line interconnection system and method of assembly thereof, suitable for miniaturization, automatic assembly and acceptance of either shielded or unshielded transmission lines in a network.

Another object is to provide an interconnection system with improved structural integrity with wires bonded to its insulation and with the insulation in turn bonded to a cement and sealer material forming part of a dielectric of a substrate.

Other objects and many attendant advantages of the present invention will become apparent upon perusal of the following detailed description taken in conjunction with the accompanying drawings, wherein.

Figure 5:
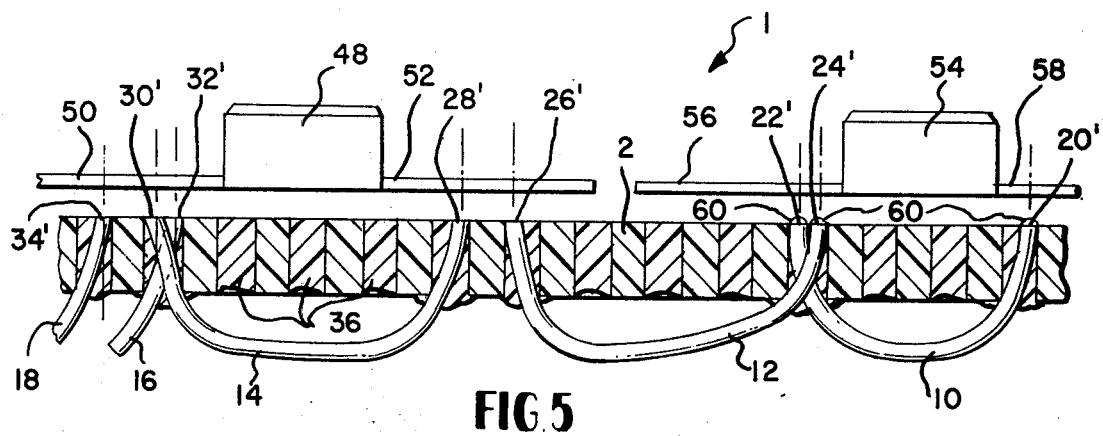
FIG. 5 is a fragmentary diagrammatic view in the form of a section along the line 5—5 of FIG. 4 and further illustrating a pair of microelectronic circuit components, the leads of which are directly connected to the transverse end areas of the transmission lines or to solder droplets adhered to the transverse end areas of the transmission lines.
Figure 7:
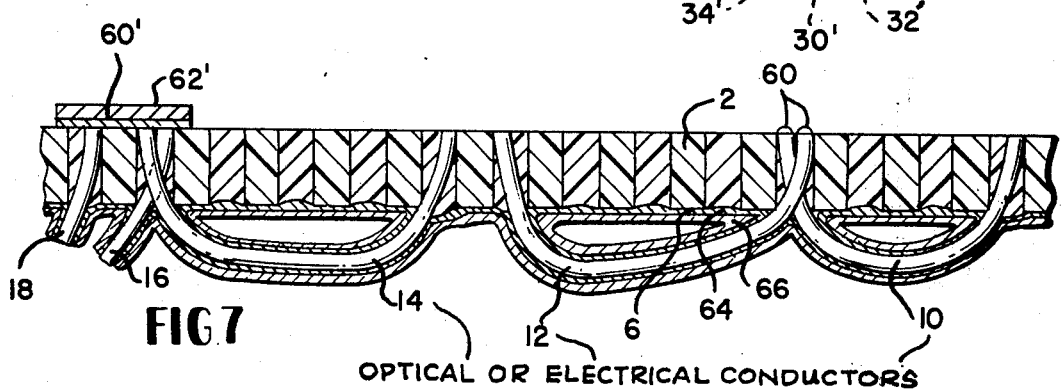
Figure 8:
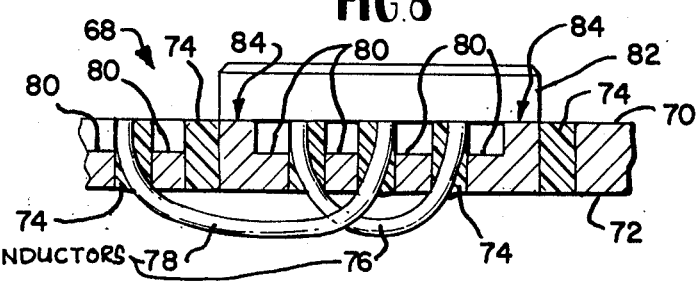

FIG. 7 is an enlarged fragmentary diagrammatic view of another modification of the preferred embodiment as shown in FIG. 5, wherein the transmission line lengths bridging from point-to-point locations are provided thereover with a metallized layer, the adjacent planar surface of the substrate also being provided thereover with the metallized layer, and with selected transverse end areas of the transmission lines which form the energizable signal energy planes being provided with metallized electrical pads or solder droplets, or not, as desired;

FIG. 8 is an enlarged diagrammatic view of an alternative substrate, shown in cross section and in the form of a metal material selectively etched to provide electrical grounding contacts and recessed portions encircling the energizable signal energy planes of the illustrated transmission lines.

Figure 2:
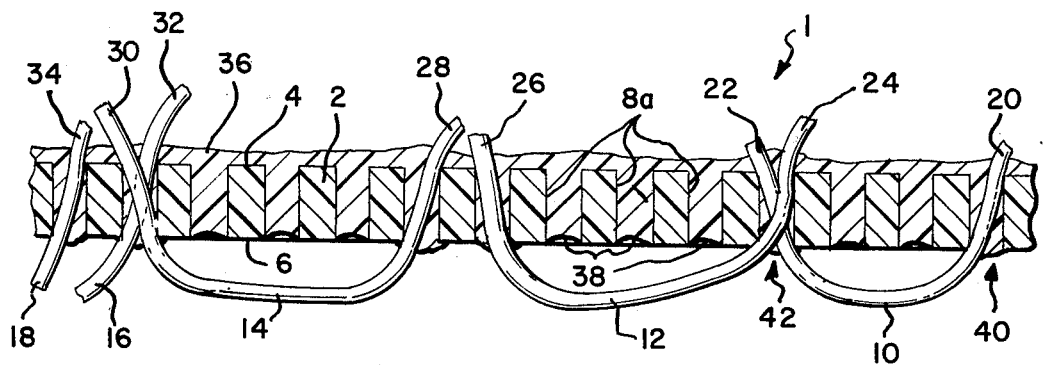
FIG. 2 is a diagrammatic representation of the preferred embodiment as shown in FIG. 1, with the transmission line strands being anchored to the substrate by sealant and filler material.
Figure 3:
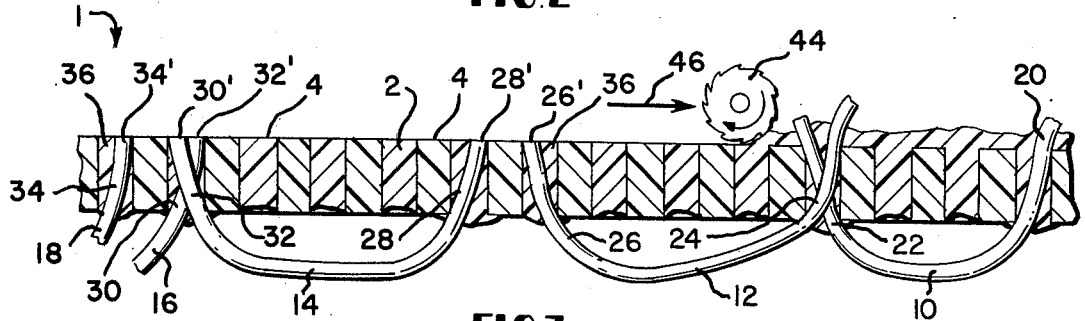
FIG. 3 is a diagrammatic representation of the preferred embodiment as shown in FIGS. 1 and 2, further illustrating the transmission line strand ends being cut generally transversely to provide transverse, exposed end portions in the form of energizable signal energy planes anchored at the selected point-to-point locations on the substrate.
Figure 13:
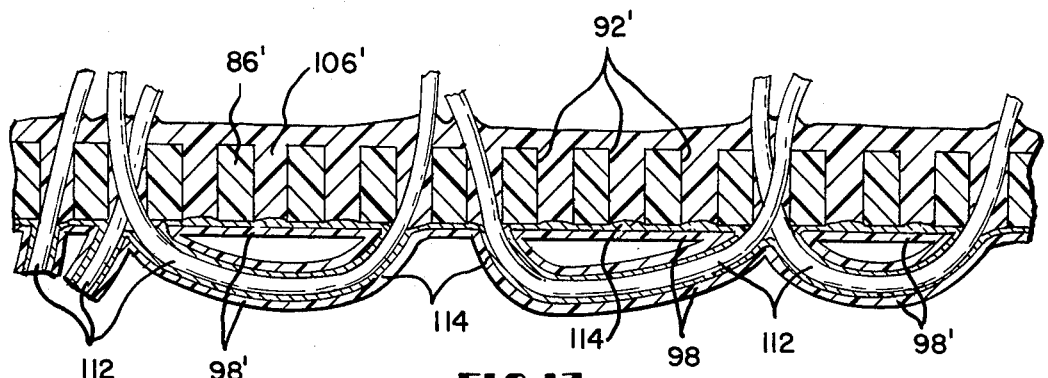
Figure 14:
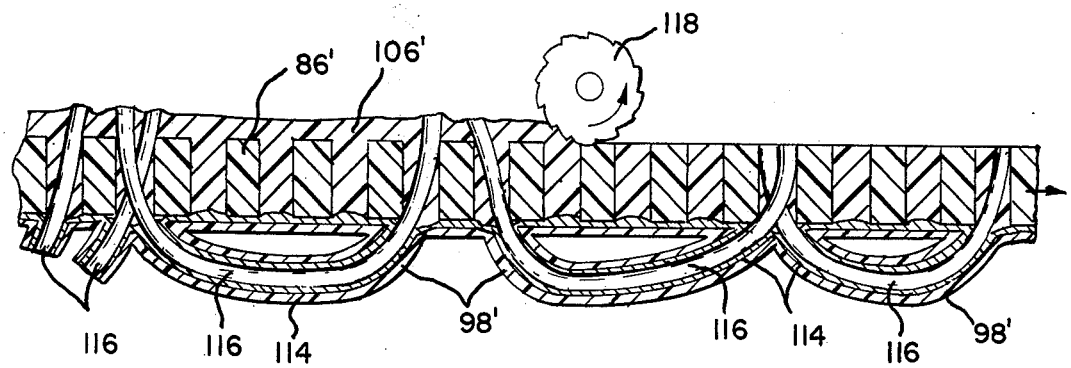
Figure 15:
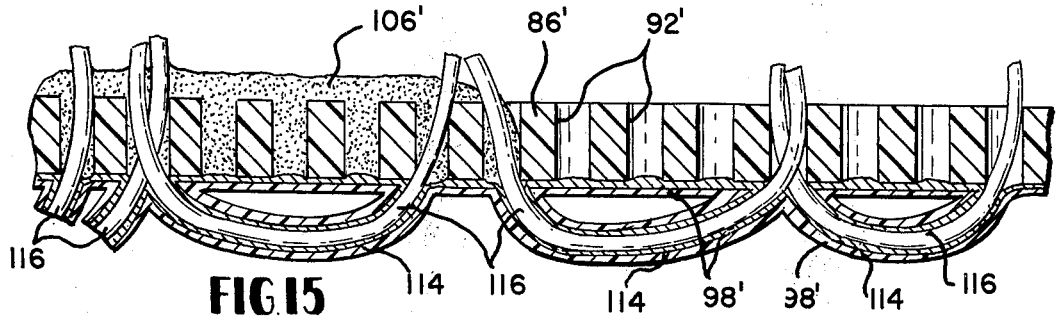
Figure 28:
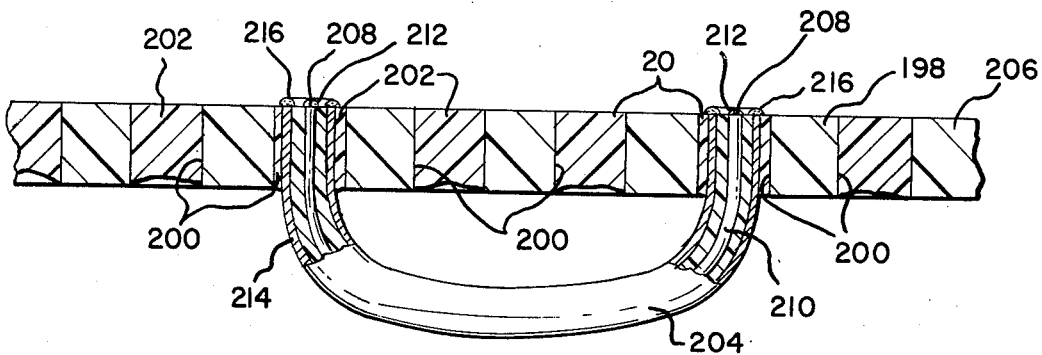
Figure 29:
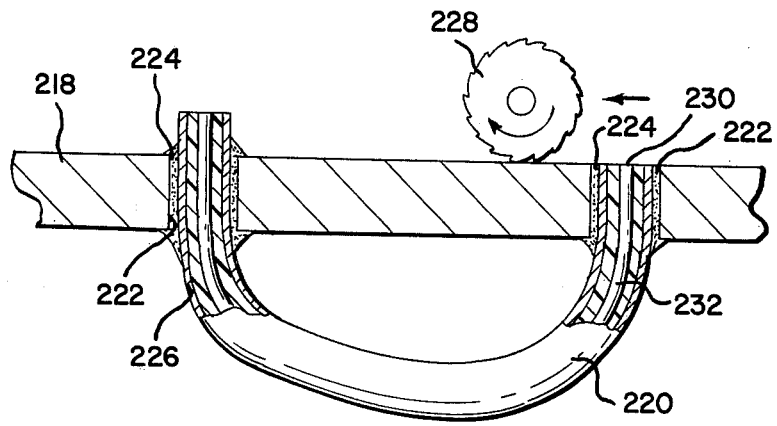
Figure 30:
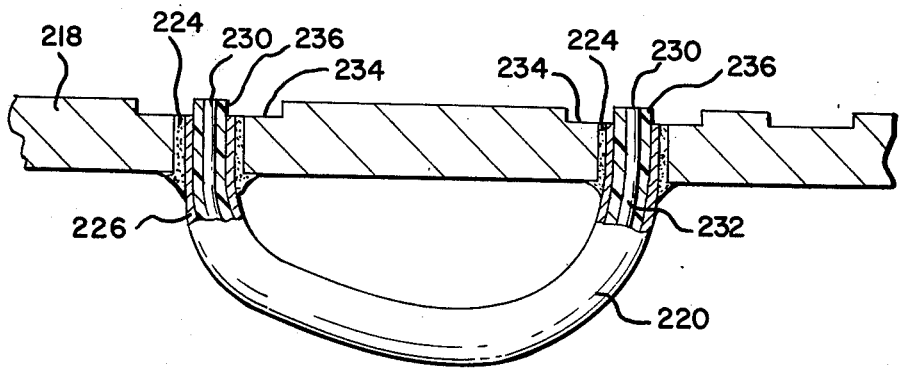
Figure 31:
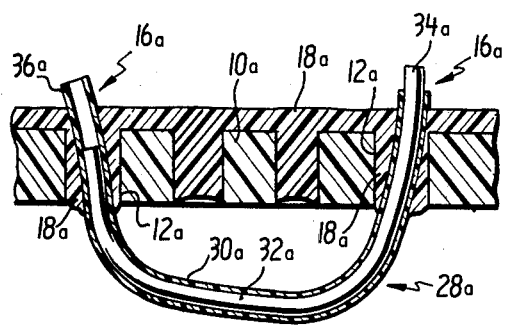
Figure 36:
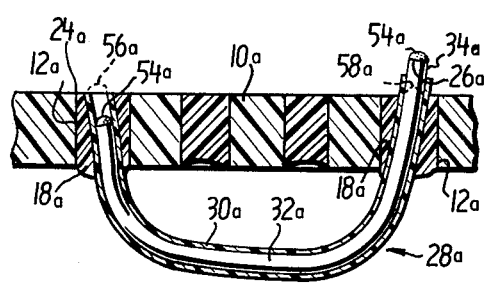
Figure 32:
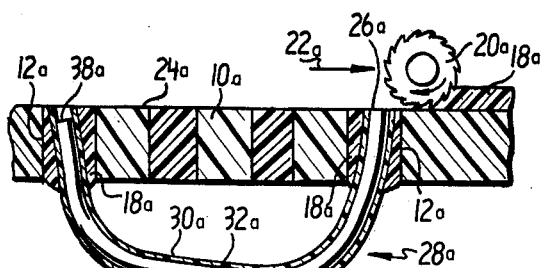
Figure 37:
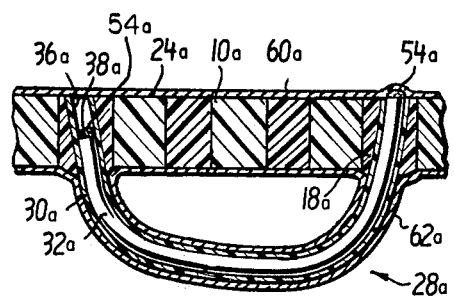
Figure 33:
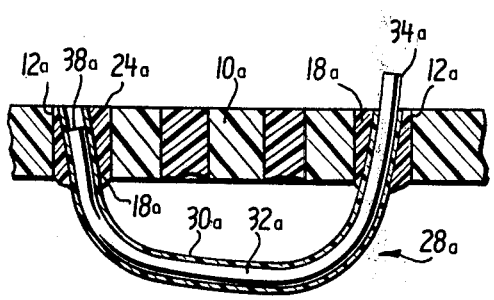
Figure 39:
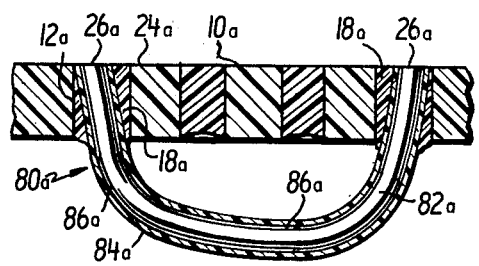
Figure 38:
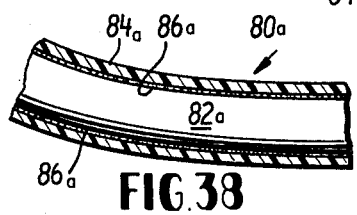
Figure 34:
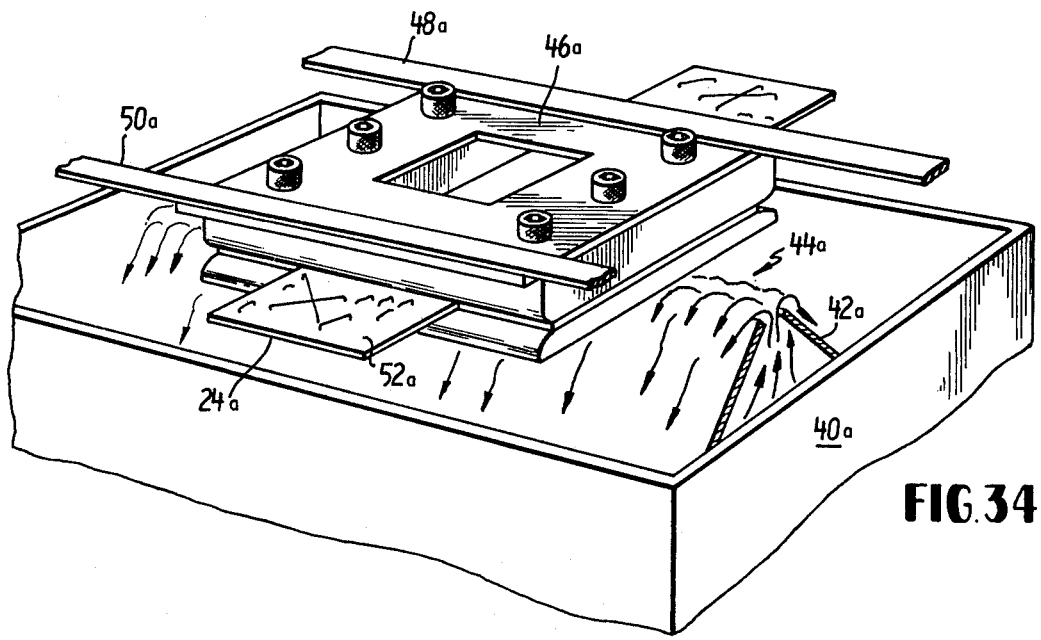
Figure 35:
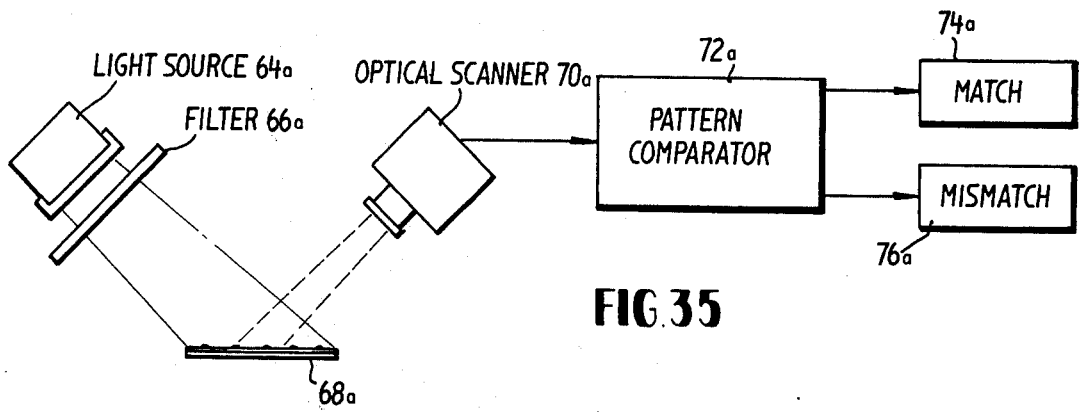
Figure 41:
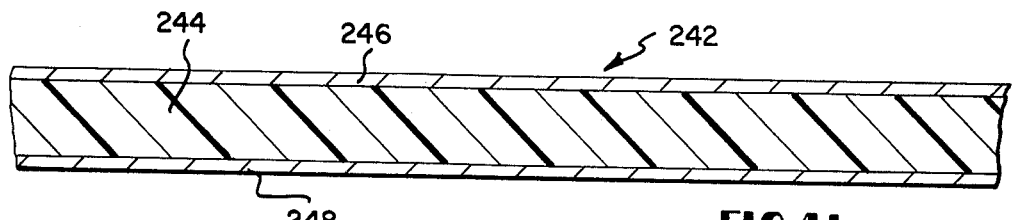

FIGS. 9, 10 and 11 are enlarged diagrammatic representations of another preferred embodiment according to the present invention, further illustrating the details of fabrication thereof;

FIG. 12 is an enlarged fragmentary diagrammatic representation of a modification of the preferred embodiment as shown in FIGS. 9–11 and further illustrating the details of fabrication thereof;

FIGS. 13 and 14 are enlarged fragmentary diagrammatic representations of another preferred embodiment according to the present invention illustrating the sequence of fabrication thereof;

FIG. 15 is an enlarged fragmentary diagrammatic representation of a modification of the preferred embodiment as shown in FIGS. 13 and 14;

FIGS. 16, 17, 18, 19 and 20 are enlarged fragmentary diagrammatic representations of a substrate according to the present invention shown in cross section and provided with fabrication techniques adapting the substrates for various electronic components;

FIGS. 21, 22, 23 and 24 are enlarged fragmentary diagrammatic views illustrating alternative transmission line interconnection techniques;

FIGS. 25, 26 and 27 are enlarged fragmentary diagrammatic views with parts in partially exploded configuration and illustrating other alternative transmission line interconnection techniques; and FIGS. 28, 29 and 30 are enlarged fragmentary diagrammatic views of an alternative interconnection technique adapting the present invention with coaxial shielded transmission lines;

FIG. 31 is a magnified illustration of a portion of a structure similar to that illustrated in FIG. 2, illustrating the use of a length of conventional insulated wire as a transmission line segment;

FIG. 32 is a magnified structure similar to that of FIG. 31 illustrating the use of a length of conventional insulated wire as a transmission line segment;

FIG. 33 illustrates a structure similar to that of FIG. 32 showing a further situation in which conventional insulated wire is used in a structure similar to that illustrated in FIG. 3, but subsequent to the planing or grinding operation;

FIG. 34 is a perspective schematic illustration of a wave soldering machine;

FIG. 35 is a schematic block diagram of an apparatus for optically checking the continuity of an assembled interconnection board;

FIG. 36 is a magnified structure illustrating the use of conventional insulated wire in an interconnection system subsequent to the application of solder to the interconnection system;

FIG. 37 is a structure similar to that of FIG. 36 further illustrating a conductive coating applied to the interconnection system structure;

FIG. 38 is a magnified illustration of a section of bonded wire adapted for use with the present invention;

FIG. 39 is a structure similar to FIG. 36 illustrating the use of bonded wire;

FIG. 40 illustrates a modification of the invention shown in FIG. 39;

FIGS. 41–45 illustrate another preferred embodiment during various stages of manufacture; and FIG. 46 illustrates another preferred embodiment of the invention.

Figure 1:
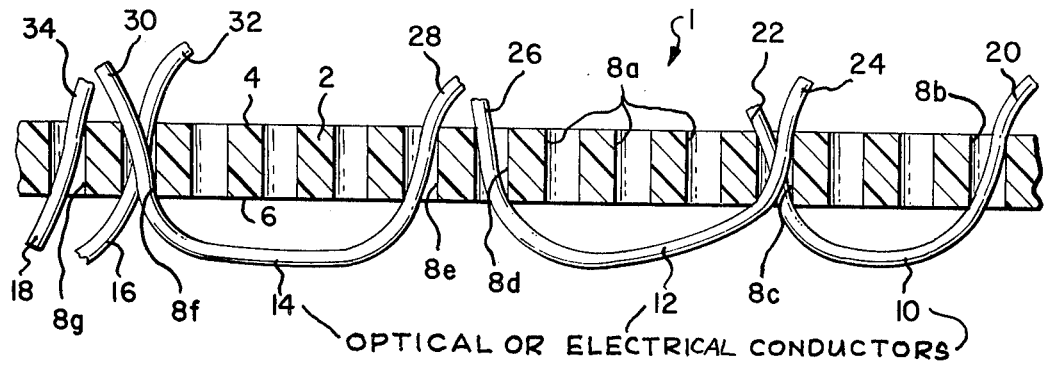
FIG. 1 is a diagrammatic representation of a substrate in cross section and provided with a matrix of apertures and with lengths of transmission line strands bridging between discrete point-to-point locations of the substrate.

With more particular reference to the drawings, there is shown in FIGS. 1, 2, 3 and 4, an interconnection system 1 according to a preferred embodiment of the present invention in various stages of assembly. With reference to FIG. 1, the system includes a substrate 2 generally of plate or board configuration having opposed generally planar surfaces 4 and 6. The substrate 2 is provided with a plurality of apertures, some of which are indicated at 8a, arranged desirably in a matrix. Discrete lengths of transmission line strands 10, 12, 14, and portions of additional strands 18 and 16, are then selectively bridged between discrete point-to-point locations on the substrate, which locations are determined by the locations of the selected apertures. The strand 10 includes one end portion 20 thereof threaded through and in registration with a selected matrix aperture 8b, while the remaining end portion 22 of the strand 10 is selectively threaded into and in registration within another selected matrix aperture 8c. The strand 12 includes one end portion thereof 24 selectively threaded into and in registration with the aperture 8c together with the end portion 22 of the strand 10. The remaining end 26 of the strand 12 is selectively threaded through and in registration within another selected matrix aperture 8d. From inspection of the preferred embodiment as shown in FIG. 1, each of the strands 10 and 12 are thereby selectively bridged between discrete point-to-point locations on the substrate, with their respective end portions in registration with, and more specifically, threaded through a selected matrix aperture. The relative stiffness of each of the strands prevents their flexing out of the selected matrix locations. In similar fashion, the strand 14 has its end portions 28 and 30 respectively received in selected apertures 8e and 8f. For purposes of illustration, an end portion 32 of the strand 16 is located in registration within the aperture 8f, and the end portion 34 of the strand 18 in threaded through and in registration within another selected aperture 8g.

As shown in FIG. 2, with the exemplary illustrated strands 10, 12, 14, 16 and 18 selectively bridged from point-to-point locations on the substrate, the planar surface 4 of the substrate 2 is provided thereover with a quantity of filler material 36. As particularly illustrated in FIG. 2, the filler material completely fills all of the matrix apertures 8 except that it is permissable to form catenaries 38 adjacent to the planar surface 6 of the substrate 2. In particular, the filler material 36 is applied by painting, spraying, casting, molding or any other desired applying operation to generally encircle the end portions of each of the interconnected strands and to at least partially fill the apertures receiving the strands. In some cases as shown at 40 in FIG. 2, the filler material completely fills the selected apertures into which the strand end portions are located. In addition, capillary action between a strand end portion and its encircling aperture sidewall may cause the filler material to flow somewhat beyond the surface 6 of the substrate 2. Although, not an object of the present invention, such occurrences do not adversely affect the attained objects and advantages of the present invention. When all the matrix apertures are at least partially filled by the filler material 36, the filler material is then cured or subsequently rigidized or solidified to form an integral part of the substrate 2. Also the filler material is rigidized to anchor each end portion of the selectively bridged strands to the substrate and additionally form seals encircling each of the strand end portions. In the preferred embodiment thus far described, the filler material 36 is added subsequent to positioning the strand lengths. However, the preferred embodiment may also be practiced by first applying the filler material to the matrix apertures and then selectively positioning the strands between discrete point-to-point locations on the substrate before the filler material becomes self-rigidized or is subsequently treated to become rigidized. Alternatively, the filler material 36 may be selectively or discretionarily applied directly into the discrete matrix apertures without a need for covering the surface 4 of the substrate 2. Among suitable dielectric filler materials found to be useful include, epoxy which is self-curing under ambient conditions or applied heat, or any other generally flowable crystalline or noncrystalline dielectric material which is self-solidifying or requires treatment with a solidifying agent, such as a polymerizing agent, a curing agent or heat.

With reference to FIG. 3, a preferred embodiment of the interconnection system is completed by transversely forming the anchored end portions of the transmission line strands with exposed transverse end areas in the form of precisely located energizable signal energy planes. By way of example, as shown in FIG. 3, a rotatable cutting wheel diagrammatically shown at 44 may be traversed from left to right as illustrated in the direction of the arrow 46, thereby cutting transversely the end portions 34, 30, 32 28 and 26 and thus forming corresponding exposed transverse end areas 34', 30', 32', 28' and 26' either flush with or otherwise adjacent to the surface of the substrate. By completion of the machine operation as shown in FIG. 3, the remaining end portions 24, 22 and 20 of the exemplary strands 12 and 10 may also be formed with exposed transverse end areas. As shown, the transverse end areas are generally flush with the surface 4 of the substrate 2, however, in practice it may be desirable to form the transverse end areas on slightly protruding end portions of the interconnected strands. The illustrated cutting operation also removes excess filler material on the substrate surface 4. As an alternative, a relatively thin layer of filler material may be left on the surface 4 to provide a dielectric coated substrate. Also any other desired forming operation may be substituted for the cutting operation to result in formation of the transverse strand end areas. The preferred embodiment thus shown and described is well suited for acceptance of interconnected strands in the form of either solid optical or electrical conductors. The transverse end areas of the strands which are transversely cut, or otherwise transversely formed, thus provide discrete energizable signal energy planes through which the electrical or optical signals are transmitted. Optical or electrical components may then be mounted to the substrate and operatively attached to the signal energy planes.

Figure 4:
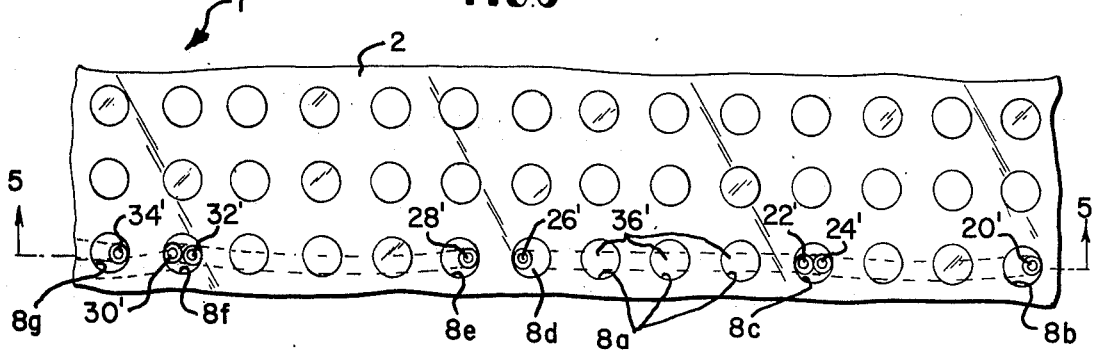
FIG. 4 is a fragmentary diagrammatic representation of a plan view of the preferred embodiment shown in FIG. 3, further illustrating in detail the transverse end areas of the transmission line strands in the form of insulated conductors, defining the energizable signal energy planes.

As shown in FIG. 4, the strands 10, 12, 14, 16 and 18 may be in the form of insulation covered electrical conductors. The transverse energizable planes are thus the transverse conductor end surfaces exposed by the cutting or other suitable transverse forming operation. In the completed embodiment, additional energizable planes 24', 22' and 20' are provided on the corresponding ends of the strands 12 and 10.

FIG. 5 diagrammatically illustrates a practical application of the preferred embodiment as shown in FIG. 4. A microelectronic circuit component or chip 48 includes an exemplary elongated conductive lead 50 overlying each of the signal energy planes 34', 30' and 32'. Another opposed elongated conductive lead 52 overlies each of the energizable planes 26', 28' and 25'. In practice, the leads 50 and 52 may be electrically bonded directly to the respective overlying energy planes by a suitable bonding or welding technique. According to a modified bonding technique, reference is again made to FIG. 5, wherein there is shown another microelectronic component or chip 54, with a conductive lead 56 overlying the energizable planes 22' and 24', and with another opposed lead 58 overlying the energy plane 20'. A solder droplet 60 is adhered directly to each of the energizable planes 22', 24' and 20' enabling solder bonding of the leads 56 and 58 directly to the respective energizable signal energy planes. Accordingly, electrical signals are transmitted through the energizable transverse planes of the interconnected transmission lines and directly to the attached leads of the chips 48 and 54.

Figure 6:
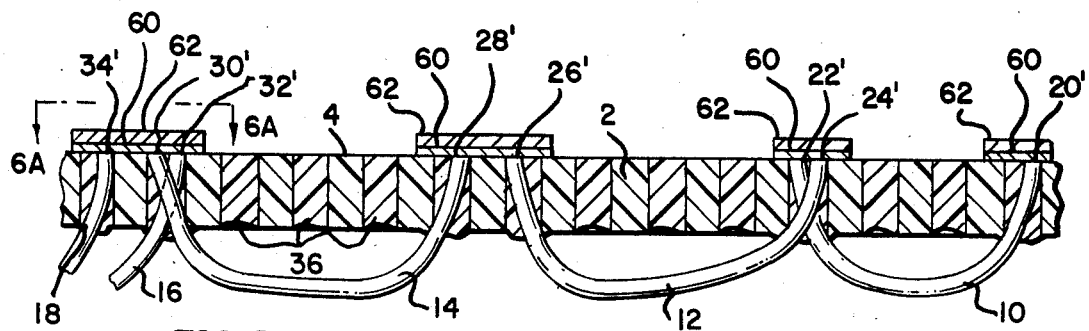
FIG. 6 is an enlarged fragmentary diagrammatic view illustrating a modification of the preferred embodiment as shown in FIG. 5, wherein the transverse end areas which define the energizable signal energy planes are provided with adhered metallized electrical pads.

With reference to FIG. 6, there is illustrated a modification of the preferred embodiment as shown in FIG. 5 including a plurality of discrete electrical pads or other energizable, enlarged signal planes adhered directly to the transverse energizable planes of the interconnected transmission lines 10, 12, 14, 16 and 18. More particularly, each of the pads is formed by a first metallized layer 60, of electroless plating, for example, followed by a relatively thick metallized layer 62 of electrolytic plating. For example, the metallized pads may be formed by masking or other selective plating techniques or, alternatively, by plating the entire surface 4 of the substrate 2 and selectively etching.

Figure 6A:
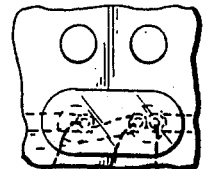
FIG. 6A is a fragmentary enlarged diagrammatic view taken along the line 6A—6A of FIG. 6, further illustrating the details of a selected electrical pad.

FIG. 6a comprises a plan view of an exemplary pad formed by the described metallizing operations, resulting in a pad which is capable of adhering to the surface 4 of the substrate 2 and also adhering to and interconnecting the energizable planes 34', 30' and 32' of the respective transmission line strands. Accordingly, what has been shown and described in each of FIGS. 5, 6, 6A and 7, is a transmission line interconnection system resulting in an unshielded wiring network, the transverse end areas of the wiring insulated conductors providing energizable signal energy planes in the form of transverse conductor surfaces to which may be directly adhered either microelectronic component leads, solder droplets or metallized electrical pads.

With reference to FIG. 7, another modification of the preferred embodiment as shown in FIG. 3 will be described in detail. The preferred embodiment of FIG. 7 includes the plurality of interconnected strands 10, 12, 14, 16 and 18 in the form of either electrical or optical conductors which are transversely cut or otherwise transversely formed to provide energizable signal energy planes through which corresponding electrical or optical signals are transmitted. In addition, the FIG. 7 embodiment includes metallized shielding applied over the surface 6 of the substrate and over the length of the interconnected electrical or optical conductors. More specifically, as shown in FIG. 7, the planar surface 6 of the substrate 2 is provided thereover with a layer of metallized shielding applied, for example, by electroless plating. The lengths of the conductors 10, 12, 14, 16 and 18 which bridge from point-to-point over the substrate surface 6 are also completely covered by a contiguous layer of the applied metallized shielding layer 64. If electroless plating is utilized, it is followed by an electrolytic plating operation to deposit a relatively thick and permanent metallized layer 66. Thus, if any of the interconnected strands 10, 12, 14, 16 and 18 are optical conductors, such metallizing layers provide reflective metal barriers encircling the optical conductors for reducing optical signal attenuation and optical cross talk. If any of the interconnected strands are insulated electrical conductors, the metallizing layer provides electrical grounding to the metallized substrate surface 6, as well as electrical shielding for the entire conductor lengths from point-to-point. In effect, the metallized layer converts the insulated electrical conductors into discrete coaxial transmission lines. To insure void free plating, commercially available surface activated strands are used. The inherent spreading ability of such strand surfaces insures spreading of the metallizing layer applied by a plating operation along the entire length of the strands. In cases wherein the interconnected strands touch one another, their activated surfaces readily create wicking of the applied plating to insure that each strand becomes coated with its own discrete layer of metallized plating. The shielded transmission lines shown in FIG. 7, are well suited for direct attachment of either electrical or optical components as described in conjunction with the embodiment as shown in FIG. 3.

Alternatively, the discrete electrical pads and solder droplets 60, disclosed in conjunction with the embodiments as shown in FIGS. 5 and 6 may be incorporated similarly into the embodiment of FIG. 7. By way of example, only, FIG. 7 illustrates selected droplets 60 a selected and exemplary electrical pad formed by a relatively thin layer of electroless plating 60' similar to the layer 60 as shown in FIG. 6. The layer 60' is selectively adhered to the substrate and also to selected transverse ends of selected strands, such as the strands 18 and 16. A selectively adhered, relatively thick metallized layer 62' of electrolytic plating is then provided over the layer 60' to result in the completed electrical pad. Thus, the embodiment as shown in FIG. 7 is well adapted for providing a metallized shielding layer for interconnected strand lengths in the form of either optical or electrical conductors. In the case of optical conductors the metallized layer provides shielding from optical interference and cross talk. In the case of insulated electrical conductors, the shielding transforms such conductors into coaxial cables, with the shielding thereof desirably grounded to the metallized surface 6 of the substrate. By using the plating operations as described, simultaneous conversion of all the point-to-point interconnected strands to a shielded interconnection system is accomplished without a need for laborious separate treatment of each strand. In addition, both the shielding and the selectively applied electrical pads may be fabricated simultaneously by the described plating techniques thereby eliminating a need for successive fabrication steps to result in a shielded interconnection system with applied pads. As an alternative, the metallized shielding may be in the form of encapsulant adhered to the substrate surface 6, and in which the interconnected strands are embedded. Any desired metal or metallized filler material may be utilized as the encapsulant.

In the preferred embodiments thus far described and shown in detail, a shielded or an unshielded interconnection system and method of fabrication thereof results from bridging lengths of transmission lines in the form of either optical or electrical conductor strands between discrete point-to-point locations. Each of the embodiments is well suited for low cost and ease in fabrication. Strand interconnection is readily accomplished either by hand or automatic machine. Redesign of a completed interconnection system is accomplished merely by removing selected strand lengths, as by cutting away selected strand lengths or by drilling out the anchored end portions of selected strands. In addition, the resultant low cost and ease in fabrication enables complete replacement of an existing embodiment to accommodate engineering changes.

In each of the embodiments disclosed, the substrate 2 may be fabricated from an insulating material, such as fiberglass or ceramic, for example, or a suitable conductive material providing heat sink and additional shielding properties. More specifically, since each of the anchored strand end portions are encircled by the dielectric filler material, which is in turn sealably adhered to the conductive matrix material, a heat sink conducting path is provided from the anchored strand portions to the matrix. Each strand is encircled by either its own insulation or by a substantial amount of dielectric filler material preventing shorting between strand and the conductive substrate.

Additionally, the substrate may be of composite construction with at least one layer each of insulating material and conductive material. In such a substrate, a layer of insulating material is advantageously located adjacent to the transverse end areas of the transmission lines additionally preventing shorting of the transmission lines to the matrix. Such placement of the insulation layer also enables direct attachment of electrical pads or other electrical or optical components to both the substrate and the transverse end areas of the transmission lines.

With reference to FIG. 8, a preferred embodiment of a conductive matrix will be described in detail. With reference to the Figure, a substrate is generally indicated at 68 with a first planar surface 70 and an opposed planar surface 72. The substrate 68 is provided with a matrix of apertures as before, with dielectric filler material, some of which is indicated at 74, at least partially filling each of the matrix apertures. Transmission lines, exemplary ones of which are shown at 76 and 78 are interconnected from point-to-point locations determined by the matrix apertures, the ends of the transmission lines being anchored in and substantially sealably encircled by the filler material 74, as is common to all of the preferred embodiments disclosed thus far. In similar fashion to the above described embodiments, the transmission lines 76 and 78 provide transverse energizable signal energy planes flush with, protruding or otherwise adjacent to the surface 70 of the substrate 68. Since the substrate 68 is of conducting material, it is advantageously selectively etched to provide recessed substrate surfaces 80 which generally encircle portions of the filler material 74 which are impervious to the etching operations due to its dielectric properties. The end portions of the transmission lines 76 and 78 are thus supported by the unetched dielectric filler material 74 in protruding positions above the recessed surfaces 80 of the etched substrate 68. An optical or microelectronic component diagrammatically illustrated at 82 may be attached directly to the transverse end areas of the now protruding transmission lines 76 and 78. Advantageously, the component 82 may be of a microelectronic type which has internal contacts thereby eliminating the necessity for elongated leads such as the leads 50 and 52 of the component 48 disclosed in conjunction with FIG. 5. Thus in the embodiment shown in FIG. 8, the matrix surfaces 80 which are recessed with respect to the protruding ends of the transmission lines 76 and 78 prevent shorting of the component 82 to the conductive substrate. In addition, certain portions of the substrate, indicated generally at 84, are not recessed, thereby providing selectively located conductive surfaces to which the grounding contacts of the component 82 may be directly attached. In such fashion, the component 82 is grounded directly to the substrate, thereby eliminating the need for separate grounding transmission lines.

FIGS. 9, 10 and 11 diagrammatically illustrate a fabrication sequence resulting in another preferred embodiment of a substrate according to the present invention. With reference first to FIG. 9, there is shown generally at 86 a substantially rigid fixture having a planar surface 88 and an opposed generally planar surface 90. The fixture 86 is provided with a matrix of apertures, some of which are shown at 92. Lengths or strands or transmission lines, two of which are shown at 94 and 96, are bridged between point-to-point locations determined by selective aperture locations. The ends of the strands are selectively located in corresponding selectively located apertures 92 thereby providing an interconnected network of transmission lines. When all of the transmission line lengths are desirably interconnected between point-to-point locations on the fixture, a removable encapsulant shown diagrammatically at 98 is applied by a nozzle 100 or any other application apparatus to completely encapsulate the point-to-point bridged lengths of the strands and provide a planar surface 104 adjacent to the fixture. Since the encapsulant 98 is generally flowable, a relatively thin coating or layer of a suitable parting agent 102 may be applied over the surface 88 of the fixture 86 prior to point-to-point interconnection of the strand lengths. Accordingly, the relatively thin parting agent 102 will be pierced upon insertion of the strand lengths into the selected apertures 92. The flowable encapsulant 98 may be of any generally flowable material which is subsequently self-curing or otherwise rigidized by the subsequent application of heat, a curing agent, a polymerizing agent, or other rigidizing agent.

FIG. 10 illustrates the preferred embodiment of FIG. 9 inverted with the fixture 86 removed from the exemplary interconnection strands 94 and 96, and also with the encapsulant material 98 in rigidized condition and physically supporting the strands in their desired interconnected positions. As shown, the end portions 94' and 96' of the exemplary strands 91 and 96, respectively, protrude substantially from the rigidized encapsulant 98. However, immediately adjacent to the planar surface 104 of the encapsulant, the strand end portions 94' and 96' are rigidly supported in precisely located protruding configurations. As shown in FIG. 10, a layer of permanent substrate material 106 is applied over the planar surface 104 of the encapsulant material 98 in order to sealably encircle such precisely located protruding portions of the strand end portions 94' and 96'. The permanent substrate material 106 is applied by a suitable spraying, depositing, casting or other applying techniques. The substrate material 106 is generally flowable so that it can be puddled or otherwise formed into a layer having a generally planar surface 110. The substrate material 106 is subsequently rigidized by choosing a material which is self-curing, or is cured or otherwise solidified or rigidized by the application of heat, a curing agent, a polymerizing agent or other suitable rigidizing agent, thereby sealably encircling and anchoring the end portions 94' and 96' of the interconnected strands 94, 96. As shown in FIG. 11, when the permanent substrate material 106 is solidified, the end portions of the strands 94, 96 are positively anchored therein, permitting removal of the removable encapsulant material 98 from the point-to-point bridged lengths of the strands. As shown in the Figure, heat, pressurized fluid, solvent or other suitable softening agent may be applied by a suitable source illustrated diagrammatically at 112 for removing completely the encapsulant material from the lengths of the interconnected strands 94 and 96. The end portions 94' and 96' of the strands 94 and 96 are then suitably formed with the disclosed transverse exposed end areas to provide the desired energizable signal energy planes. For example, the strand end portions may be cut by the diagrammatically shown cutting wheel 114 either flush with or slightly protruding from the planar surface 110 of the substrate material 106 to provide the transverse exposed end areas. The strands 94 and 96 may comprise either optical or electrical conductors as in the heretofore discussed embodiments and may be provided thereover with a metallized shielding layer such as the layers 64 and 66 as disclosed in conjunction with the embodiment of FIG. 7. In addition, the metallized pads formed by the selectively located metallized layers 60' and 62' of the embodiment disclosed in FIG. 7 may or may not be added. If the substrate 106 is fabricated from a metal or a metallized material, it may be selectively etched to provide recessed surfaces encircling each of the strand end portions 94' and 96', in similar fashion as described in conjunction with the embodiment as shown in FIG. 8. As a particular feature of this embodiment, the substrate material is the same as the filler material which anchors the strands and becomes a part of the substrate thickness.

In a modification of the embodiment shown in FIGS. 9, 10 and 11, the encapsulant material 98 may be selected from a suitable metal or metallized material to provide non-removable electrical or optically reflective encapsulant shielding for the lengths of the strands 94 and 96. Thus, in such a modification the embodiment shown in FIG. 11, the metal or metallized encapsulant 98 is retained adhered to the permanent substrate material 106.

As shown in FIG. 12, yet another modification of the preferred embodiment shown in FIGS. 9, 10 and 11 will be described in detail. In this modification, the matrix apertured fixture 86 is not removed but is retained to become a permanent part of the completed substrate. Accordingly, application of the substrate material 106 covers the fixture 86 and entirely fills all the apertures 92 thereof. The end portions 94' and 96' of the strands are then suitably formed with exposed transverse end areas flush with or slightly protruding from the planar surface 110 of the rigidized substrate material 106. The fixture 86 is desirably of metal or metallized material providing heat sink properties. The fixture generally encircles the strand end portions 94' and 96' as well as the substrate and filler material 106 received in the apertures of the fixture. In addition, the encapsulated material 98 may be removed, as discussed in conjunction with the embodiment shown in FIG. 11, or such material may be of metal or metallized encapsulant material providing electrical or optically reflective shielding from the embedded strand lengths 94 and 96.

In the embodiments shown and described in detail thus far, the transmission lines comprise conductors which are either optical, electrical or insulation covered electrical conductors. FIGS. 13, 14 and 15 are directed to modifications of such embodiments of the present invention wherein the transmission lines thereof are in the form of conduits for reflective optical, fluidic or electrical waveguide transmission. With reference to FIG. 13, a substrate 86' is provided with a matrix of apertures some of which are shown at 92'. Lengths of strands 112 are interconnected between point-to-point locations determined by selected aperture locations. As heretofore disclosed, the aperture end portions are inserted into selected ones of the apertures 92' and are anchored therein by filler material 106' which is coated over the substrate 86' as shown in FIG. 13, or alternatively is discretely applied to each aperture, in order that the apertures 92' are at least partially filled with a quantity of the filler material. One surface of the substrate 86', as well as all of the point-to-point bridging lengths of the strands 112 are provided thereover with a metal or metallized layer 114, corresponding to the metallized layers 64 and 66 of the preferred embodiment as shown in FIG. 7. By comparison, the embodiment shown in FIG. 13 is similar to the preferred embodiment in FIG. 7, except that the metal or metallized coating 114 is additionally provided thereover with a coating of encapsulant material 98' which may be in the form of a thermoplastic, a thermosetting plastic or other suitable material which becomes rigidized for mechanically supporting the metal or metallized coating 114 provided over the strands 112. With reference to FIG. 14, another important distinction between the embodiments of FIG. 13 and 7 will be described in detail. Whereas, the strands 10, 12, 14, 16 and 18 of the embodiment of FIG. 7 are either optical or electrical conductors or a mixture thereof, the strands 112 are fabricated from a stretchable elastomeric material such as rubber or a material having a highly slippery surface such as teflon. The strands 112 are removed from their encircling metal or metallized layers 114 by stretching and pulling out the strands 112. FIG. 14 illustrates the preferred embodiment with the strands 112 thus removed, the metal or metallized layers 114 remaining to provide metallized conduits 116 interconnected between point-to-point locations on the substrate 86'. The conduits 116 are suitably formed with exposed transverse end areas providing transverse energizable signal energy planes through which may be transmitted reflected optical, fluidic or electrical waveguide signals. As shown in FIG. 14, forming of the transverse ends may be accomplished by a cutting or grinding operation performed by the diagrammatically illustrated cutting wheel 118. The operation also may be utilized to remove excess quantities of filler material 106' from the surface of the substrate 86'. Although all of the excess filler material 106' is shown being removed, it is often desirable to retain a relatively thin layer of filler material on the surface of the substrate 86' to form a composite substrate. Since the metal or metallized layers 98' which form the conduits 116 are relatively thin, the rigid material 114 structurally strengthens and supports the conduits 116 preventing them from damage. As another modification, instead of the layer 114, a metal or metallized encapsulant may be used which totally encapsulates the interconnected strand lengths and then forms the conduits 116 when the strands are removed from the encapsulant. According to another modification, the strands 112 may be selected from a material which is readily dissolved by a suitable solvent or which has a relatively low vaporization temperature such that the strands are removed upon the application of either the suitable solvent or heat.

With reference to FIG. 15 a further modification of the embodiment shown in FIG. 13 will be disclosed in detail. With reference to the Figure, the filler material 106' may be selected from a material which is suitably vaporized or dissolved, eliminating the need for a cutting or grinding operation by the exemplary cutting wheel 118. Thus FIG. 15 illustrates the filler material 106' being entirely removed from the substrate 86' by vaporization or dissolution prior to removal of the strands 112. Alternatively, both the strands 112 and the filler material 106' may be selected from materials which can be simultaneously removed by a dissolving or a vaporizing operation. In the embodiment shown in FIG. 15, the transverse end areas of the conduits 116 which form the energizable signal energy planes comprise the transverse and configurations of the matrix apertures 92' which are thus exposed and formed upon removal of the strands 112 and filler material 106'.

The fabrication techniques disclosed in conjunction with FIGS. 9, 10, 11 and 12 may be readily adapted for forming the interconnected transmission line conduits of the embodiments as described and shown in FIGS. 13, 14 and 15. Thus, the strands 94 and 96 may be replaced by the removable strands 112. The substrate 86' corresponds to either the removable or permanent fixture 86, the filler material 106' corresponding to the filler material 106. As an alternative, the layer 114 may be eliminated and the metal or metallized layer 98' fabricated into an encapsulant material rather than a relatively thin coating, thereby corresponding to the metal or metallized non-removable encapsulant 98 shown in FIG. 12.

Figure 16:
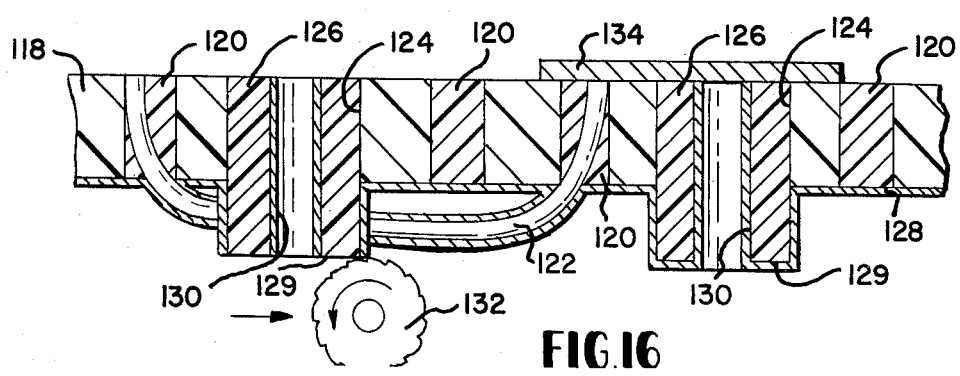

FIG. 16 diagrammatically illustrates an application of the preferred embodiments with the addition of conductively lined sleeves. More specifically, a substrate 118 having the apertures thereof at least partially filled with a quantity of filler material 120 is shown with transmission line lengths, one of which is shown at 122, bridged between selective point-to-point aperture locations. Selected apertures are enlarged as shown at 124 to receive therein enlarged diameter dielectric sleeves 126. A metal or metallized layer 128 is provided over one surface of the substrate 118, encircling each of the conductors 122 to provide shielding and coating the ends 129 and the inner diameter 130 of each of the sleeves 126. The coating 128 may be applied by a plating operation, for example. The coating portions which cover the ends 129 of the sleeves 126 are removed by grinding with the wheel diagrammatically shown at 132, or by any other suitable removing operation. Thus any of the preferred embodiments utilizing conductor strands may be provided with insulating sleeves having plated interiors. In addition, an exemplary electrical pad 134 is adhered to the substrate and connects a plated sleeve interior with a conductor 122. The internally plated dielectric sleeves 126 accepts existing electrical connector hardware in the form, for example, of elongated conductive posts providing either clip type or wire wrapping type electrical terminals.

Figure 17:
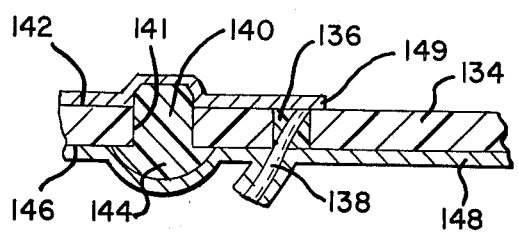
Figure 18:
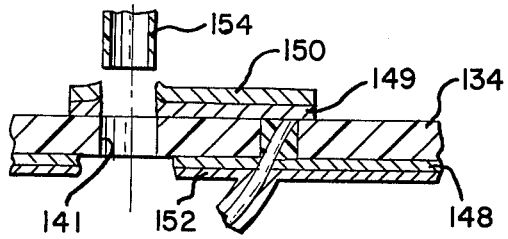
Figure 19:
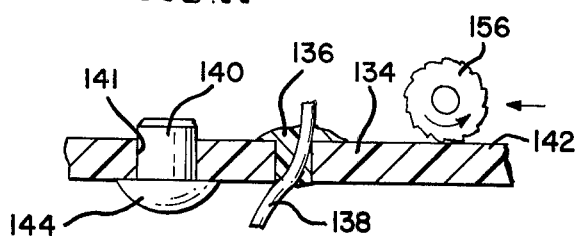
Figure 20:
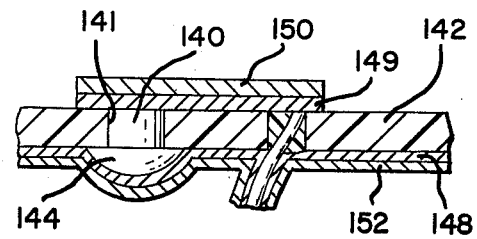

FIGS. 17 and 18 together with FIGS. 19 and 20 further illustrate fabrication techniques providing enlarged apertures through preferred embodiments of the substrate. More specifically, as shown in FIG. 17, an exemplary substrate 134 includes a matrix of apertures each of which is at least partially filled with a filler material 136 which anchors and sealably encircles an exemplary strand 138 desirably interconnected between point-to-point locations on the substrate 134. Selected matrix apertures each receives therein a shank 140 of a dielectric plug protruding above a planar surface 142 of the substrate 134, an enlarged head 144 of each plug being concentric with the corresponding plug shank 140 and in registration against the planar surface 146 of the substrate 134. With the desired plugs in place, the substrate is subjected to an electroless plating operation, providing a metallized shielding layer 148 on the substrate surface 146, the interconnected strand lengths 138 and the head 144 of each of the plugs. In addition, metallized pads one of which is shown at 149 may be provided to interconnect a strand 138 to a plug shank location. The pad 149 may be applied by the same plating operation, either by selective deposition or by electroless plating followed by selective etching. When the electroless plating is completed, each of the plugs is removed. As shown in FIG. 18, the portion of the pad 149 which adheres to the plug shank is also removed, leaving the remaining pad 149 in encircling relationship around the aperture 141 which received the plug therethrough. In addition, the metallized layer 148 which adheres to the enlarged head 144 of the plugs is also removed, leaving substantial clearance between the metallized layer 148 and the aperture 141 which received the plug therethrough. The substrate is then subjected to an electrolytic plating operation to provide a relatively thick permanent metallized pad 150 and a permanent shielding layer 152 adhering to the metallized layer 148. Each completed aperture 141 is thus suited for receiving therethrough existing electrical hardware such as an elongated post for clip type or wire wrapping type electrical connections. In addition, each of the apertures 141 may receive therethrough a dielectric sleeve 154 providing an insulating liner for the aperture. The sleeve 154 may also be fabricated of metal to provide a conducting liner for the apertures 141.

FIGS. 19 and 20 illustrate a variation wherein the plugs are inserted in the apertures 141 prior to forming the transverse end areas of each of the interconnected strand lengths 138. More specifically, with reference to FIG. 19, with the strand lengths 138 interconnected between the desired point-to-point substrate locations, and with the plug shanks 140 in desired registration within selective apertures 141, the cutting wheel diagrammatically indicated at 156 may be utilized to trim the plug shanks 140 and the strand lengths 138 generally flushed with or slightly protruding from the surface 142 of the substrate 134. As shown in FIG. 20, the substrate is then subjected to an electroless plating operation to form the shielding layer 148 and the selected located pads 149. A subsequent electrolytic operation provides the permanent pads 150 and the permanent shielding layer 152. Then upon removal of the plugs, the shielding layers adhered to the enlarged plug heads 144 will also be removed to provide substantial clearance between the apertures 141 and the shielding layers 152 and 148. In addition, the selected pad layers 150 and 149 will be undisturbed by removal of the plugs since the plugs have been previously trimmed flushed with the planar surface 142 of the substrate. As a result, the apertures 141 extend through the substrate and desirably are covered by an electrical pad which is located on one surface of the substrate.

Figure 21:
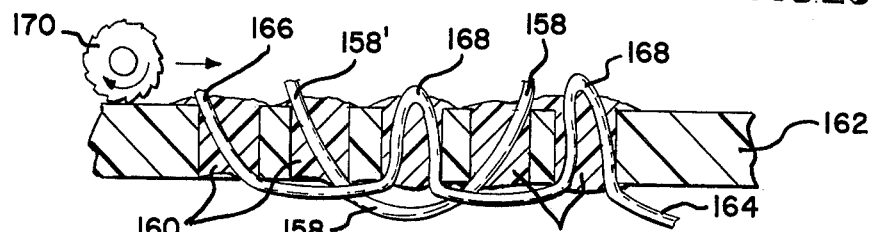
Figure 22:

FIGS. 21 and 22 diagrammatically illustrate an alternate strand interconnection technique. In the preferred embodiments disclosed thus far, the bridging lengths of interconnected transmission lines are each fabricated by a separate discrete strand, with one end portion of a strand anchored to the substrate at one point and to the other end portion of the strand anchored at another point. This is shown at FIG. 21 wherein a discrete strand 158 has its end portions 158' anchored by quantities of filler material 160 within selected matrix apertures of a substrate 162. According to another interconnection technique, the bridging lengths of interconnected transmission lines are formed by a single strand 164. An end portion 166 of the strand, as well as intermediate looped portions 168 of the strand, are located in registration within selected apertures of the substrate 152. Quantities of the filler material 160 anchor the end portion 166 and looped portions 168 within the selected apertures. As shown in FIGS. 21 and 22, the looped portions 168 of the strand 164 are removed by a suitable cutting operation, performed, for example, by the diagrammatically shown cutting wheel 170. Removal of the looped portions 168 provide a pair of strand end portions 172 and 174. If the continuous strand 164 is an optical or electrical conductor, the transverse end areas of the conductors provide energizable signal energy planes. The end portions 172 provide inlet signal energy planes, and the end portions 174 provide outlet signal energy planes. If inlet and outlet conduits are desired, the strand 164 may be in the form of a stretchable rubbery, a slippery or a readily vaporizable or dissolvable material to allow removal thereof after a metallizing operation as disclosed in conjunction with the embodiments illustrated in FIGS. 13, 14 and 15.

Figure 23:
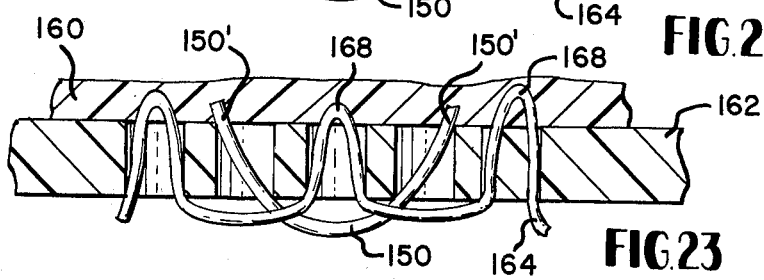
Figure 24:
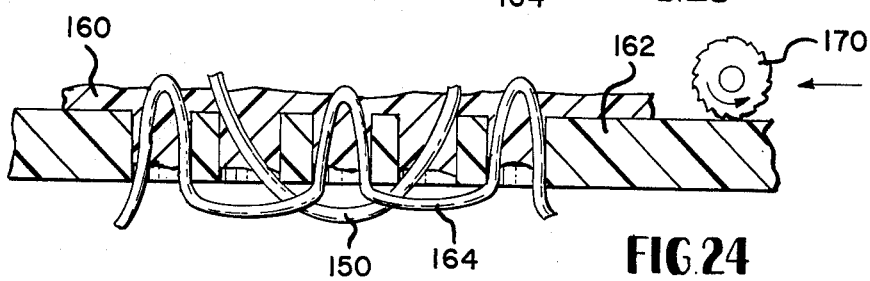

With more particular reference to FIGS. 23 and 24, an alternative method of anchoring the interconnected transmission line lengths will be described in detail. Thus, discrete lengths of strands 150 or a continuous strand length 164 is interconnected between point-to-point locations on the substrate 162 to form the bridging transmission line links as heretofore described. A relatively thick layer of filler material 160 is applied over the surface of the substrate 162. The filler material 160 may be applied after the strands 150 and 164 are interconnected. Alternatively the material 160 may be applied before interconnecting such strands, in which case the end portions 150' and looped portions 168 of the strands will be embedded in the filler material and thus be mechanically supported in their interconnected positions. After the strands 150 and 164 are in place, the filler material 160 is caused to flow by the application of heat or a suitable solvent, enabling the filler material to wick into and at least partially fill each of the apertures of the substrate 162. This is followed by forming the transverse end areas of the strands by a suitable grinding or cutting operation performed by the exemplary illustrated cutting wheel 170. With reference to FIG. 25, there is shown an alternative interconnection technique. Thus with reference to the Figure, a substrate 172, having its apertures at least partially filled with a filler material 174, is provided with interconnected lengths of strands according to the following technique. A piercing tool diagrammatically illustrated at 176 is operated manually or by automatic machine to penetrate through the filler material 174 of a selected aperture. A wire inserting mechanism, a portion of which is diagrammatically illustrated at 178, grips and inserts the end portion of a strand length 180 into the pierced filler material 174. When all the strand lengths are thus interconnected, the filler material 174 is subjected to a rigidizing operation, either by curing, or the addition of a curing agent, heat, polymerization agent or other rigidizing agent, thus adhering the filler material to the strand ends 180 and sealably anchoring them in place on the substrate 172. The strand ends are then formed with the desired transverse energy planes adjacent to the planar surface 182 of the substrate 172 as by grinding or cutting or by any other desired forming operation.

FIGS. 26 and 27 illustrate another interconnection technique especially suited for a relatively dense network of interconnected strands. More specifically, in a miniaturized system, the presence of a large number of interconnected strands may bridge over and cover some of the matrix apertures, making it difficult for insertion of strand lengths into the apertures. In FIG. 26, a substrate 184 includes a plurality of strands 188 interconnected between point-to-point locations determined by the matrix of apertures, some of which are shown at 186. The strands 188 tend to cover one of the selected apertures 186. Accordingly, to enable wiring to such aperture a locating tool diagrammatically illustrated at 190 is inserted by hand or by automatic operation through the selected aperture. The insertion of the tool forcefully displaces aside the covering strands 188 as shown in the Figure, thereby locating a free insertion path for a strand length to be connected to the aperture. More particularly, as shown in both FIGS. 26 and 27, a wire inserting apparatus, a portion of which is diagrammatically illustrated at 192, includes a gripping portion 194 for a strand 188' similar to the strand 188. As the tool 190 is withdrawn from the substrate aperture, the wire feeding mechanism follows the insertion path through the pushed aside strands 180, and inserts the end portion of the strand 188' into the selected aperture 186. Thus the use of a locating tool 190 which forms a free insertion path enables insertion of a strand from an opposed side of the substrate 184. As is common to all the disclosed embodiments, the apertures 186 may be either subsequently provided with filler material, or as shown, may be provided with filler material 196 prior to the strand interconnection operation. The locating tool 190 will also provide a piercing function to enable insertion of the strand 188' through the pierced filler material 196.

FIGS. 28, 29 and 30 illustrate another modification of the present invention wherein the interconnected lengths of the transmission line strands are in the form of discrete length coaxial cables. Thus FIG. 28 illustrates a substrate 198 having a matrix of apertures some of which are shown at 200. Each of the apertures is at least partially filled with a quantity of filler material 202. A transmission line in the form of a discrete strand length of coaxial cable 204 is bridged between discrete point-to-point locations on the substrate and is anchored to the substrate by the filler material 202 within the selected apertures 200. The ends of the coaxial cable 204 are transversely formed as by cutting or grinding for example to provide exposed transverse energizable signal energy planes adjacent to the surface 206 of the substrate 198. More particularly, the transverse end area 208 of the coaxial cable center conductor 210 provides the energizable signal energy plane. A droplet of solder 212 may be applied directly to the center conductor transverse ends 208 to enable attachment thereto of, for example, a microelectronic component. The outer conducting shielding 214 of the coaxial cable 204 terminates adjacent to the planar surface 206 of the substrate and may be provided thereover with a ring of dielectric material 216 which prevents shorting of the conductor 210 to the shielding. Alternatively, the ring 216 may also be of solder to allow attachment thereto of electrical grounding contacts, of a microelectronic component, for example. In this embodiment, the coaxial cable shielding 214 extends entirely through the substrate thickness. However, the filler material 202 completely encircles the shielding 214 as well as anchors the coaxial cable 204 to the substrate. By selecting the filler material 202 of dielectric material, the substrate 198 may be of either insulating or conducting material without a danger of shorting to the shielding 214.

FIG. 29 illustrates a modification wherein a substrate 218 is either of insulating or conducting material with a discrete length of coaxial cable 220 interconnected between selected apertures 222 of a matrix of apertures provided in the substrate 218. The filler material 224 in this case is a conducting material preferably of solder which sealably encircles the shielding 226 of the coaxial cable 220 and anchors the cable 220 to the substrate. A suitable cutting or grinding operation performed by the diagrammatically illustrated cutting-wheel 228 forms a transverse signal energy plane 230 on the ends of the coaxial cable center conductor 232. In this embodiment, the substrate 218 may be conductive, in which case the filler material 224 desirably grounds the outer shielding 226 to the substrate 218.

FIG. 30 is a modification of the preferred embodiment shown in FIG. 29. The substrate 218 is again of conductive material, it together with the solder filler material 224 and the coaxial cable outer shield 226 is selectively etched to provide a recessed surface 234 encircling the end areas 230 of the coaxial cable center conductors 232 and the coaxial cable dielectric 236, which are unaffected by the etching operation and are thereby left protruding from the recessed surface 234. Thus, what has been disclosed are preferred embodiments of the present invention consistent with the attained objects thereof. Particular advantages of the preferred embodiments result, from providing an interconnection system which does not require stripping the ends of interconnected transmission line lengths, and wherein the ends of the transmission lines are precisely located in anchored positions on the substrate, thereby minimizing the target areas to which may be attached microelectronic, fluidic, optical or electrical waveguide components. In each of the preferred embodiments, the filler material may be applied discretely to each matrix aperture to at least partially fill each aperture. Alternatively, the filler material may be applied to cover the substrate surface as well as at least partially fill the matrix apertures. Alternatively the filler material may be purposely flowed to produce the required filling by a wicking action. No matter which application technique is used, the filler material may be applied either prior to or subsequent to interconnecting the strand lengths according to any of the interconnection techniques disclosed.

In FIG. 3 a grinding wheel or equivalent milling or abraiding apparatus is schematically represented by the toothed wheel 44. The grinding or planing step removes all of the excess filler and sealant material extending above the upper surface of the substrate 2 in its original form, that is prior to the application of the filler and sealant material. The grinding or planing operation also removes the protruding ends of each of the transmission lines thereby terminating each of the transmission lines at a transverse end area which is exposed at the upper surface of the substrate 2. Each of the transverse end areas includes a discrete energizable signal energy plane, as is more fully described in the above referenced copending application. This discrete energizable signal energy plane provides a position at which external circuit elements or lead wires can be coupled to the interconnection system of the present invention. The nature of the transverse end area, and consequently of the discrete energizable signal energy plane formed thereby, is dependent upon the nature of each of the transmission lines. As is mentioned above, numerous types of transmission lines can be used with the interconnection system described herein. However in many applications which are commercially significant at the present time insulated wire transmission line segments are extremely important since they provide electrical signal transmission lines which are easily connectable to, and are highly suitable for use with, conventional electronic components and circuits. However the use of insulated wire transmission lines creates a series of problems in the type of interconnection system described above.

For example, one type of problem is illustrated in FIG. 31. As shown, a transmission line segment consisting of a length of conventional insulated wire 28*a* is inserted through a pair of matrix apertures 12*a* in a substrate 10*a*. The filler and sealant material 18*a* is then applied to the substrate 10*a* to fill all portions of the matrix apertures 12*a* not occupied by the transmission line length. The conventional insulated wire transmission line segment consists of a tubular insulator 30*a*, which normally is constructed of a conventional plastic dielectric material, surrounding a conductor 32*a*, normally formed of one or more strands of copper wire, or some equivalent highly conductive material. In FIG. 31 the conductor 32a is shown displaced with respect to the tubular insulation 30a. Thus a portion 34a of the conductor 32a is exposed, while a portion 36a of the tubular insulator 30a is empty. This type of displacement can very easily occur in the assembly of an interconnection system of the type described above, particularly when it is realized that the dimensions of the wire are much smaller than illustrated in FIG. 31. In particular, wire of the finest gauges are often used, and the lengths of the individual transmission lines are often as small as a fraction of an inch. Thus in handling the transmission line lengths prior to inserting them into the substrate 10a, and even during application of the filler and sealant material 18a, forces can be applied to the transmission line segments when they are comprised of conventional insulated wire, causing the conductive portion of the wire to be displaced with respect to the insulative portion. When automatic equipment is used to install the wires, it is particularly difficult to observe and correct this type of displacement.

The significance of the displacement discussed above is seen more clearly in FIG. 32. After the grinding or planing step, illustrated in FIG. 32, a transverse end area 26a, and thus a discrete energizable signal energy plane, is formed at the right end of the conventional insulated wire transmission line segment. However no such transverse end area is formed at the left end of the conventional insulated wire transmission line segment 28a, since the conductor 32a, which was displaced with respect to the insulation 30 does not reach the surface plane 24a formed at the upper surface of the substrate 10a subsequent to the grinding operation. Accordingly, a discontinuity exists, and is defined by the distance between a displaced end 38a of the conductor 32a and the plane 24a. Clearly if such a discontinuity occurred in a board which was being constructed for a commercial application, the board would have to be repaired or rejected. Repairing of the board would involve at least removal and replacement of the conductor 32a and subsequent grinding or planing of the end portions thereof to form the appropriate transverse end areas 26a. Alternatively the entire conventional insulated wire transmission line segment 28a may be replaced by drilling out the filler and sealant material 18a from the appropriate matrix aperture 12a. In any case, it is clear that the presence of such discontinuities causes substantial inconvenience, particularly in boards wherein dozens or hundreds of properly mounted and formed interconnections exist in combination with one or two discontinuities. Thus if the few discontinuities could be eliminated, production of completed interconnection boards could be greatly facilitated.

Referring now to FIG. 33, another type of discontinuity is illustrated. In FIG. 33 it is assumed that the grinding or planing step has successfully been completed, but that subsequent to the grinding or planing step, the conductor 32a has again become displaced with respect to the tubular insulation 30a. This situation thus represents the case in which a completed interconnection system is constructed using conventional insulated wire for the transmission line segments. Thus any time after a circuit board is completed according to the interconnection system of the present invention, the conductors 32a within the conventional wire transmission line segments 28a can become displaced by jostling or inadvertent applications of force to the surface of one of the transverse end areas 26a. Naturally this type of displacement would also cause a considerable amount of inconvenience, and would have to be repaired prior to actual use of a particular circuit board.

The difficulties pointed out above are compounded when optical continuity testing techniques are used with the interconnection system of the present invention. Briefly, in optical continuity testing an assembled circuit board which has been subjected to the step of grinding or planing is placed into contact with a quantity of molten solder. The solder adheres only to each of the exposed transverse end areas 26a, so that observation of solder bumps adhering to the surface of the substrate 10a indicates the points at which each of the transverse end areas are located. Continuity of the transmission lines relies on the basic assumption that the conductor connecting two matrix apertures is always continuous. Thus if any discontinuities exist, they exist near the end points or termination points of each of the transmission line segments. In general this assumption is extremely good, although there are exceptions, as will be described presently.

The application of solder described above is preferably performed using a wave soldering machine 40a, as illustrated in FIG. 34. The wave soldering machine 40a includes a conventional weir 42a for shaping a continuously flowing wave of molten solder 44a. A soldering fixture 46a is suspended by a pair of rails 48a and 50a above the solder wave 44a. An assembled board 52a, similar to that illustrated in FIG. 3 after the grinding operation has been completed, and is transported through the soldering fixture 46a with the plane surface 24a thereof facing downwardly and engaging the solder wave 44a. Thus each of the exposed transverse end areas 26a formed throughout the plane 24a are exposed to the solder wave 44a, and the assembled board 52a consequently emerges from the wave soldering machine 40a with a solder droplet adhering to each of the transverse end areas 26a. Naturally the solder droplet hardens to form a solder bump 54a adhering to each of the transverse end areas, as illustrated in FIG. 36.

In addition to illustrating the solder bumps 54a, FIG. 36 also illustrates a relative displacement between the conductor 32a and its tubular insulation 30a, similar to that shown in FIG. 32. Thus the normal or desired positions occupied by the solder bumps 54a, and the positions actually occupied by the solder bumps 54a immediately following the wave soldering operation are shown by the dashed lines 56a and 58a. The dashed lines 56a and 58a illustrate that the solder bumps 54a normally extend slightly above the plane 24a of the substrate 10a. Yet when the conductor 32a is displaced as illustrated in FIG. 36, the left solder bump is positioned substantially below the plane 24a, while the right solder bump is positioned substantially above the plane 24a.

FIG. 37 illustrates another embodiment of the invention wherein a layer of conductive material 60a is plated over the entire surface of the plane 24a, and also over the solder bumps 54a. The layer of conductive material 60a preferably consists of a thin layer of electroless copper over which is plated a substantially thicker layer of electrolytic copper. Naturally equivalent conductive materials may be substituted for copper, where desired. Another layer of conductive material 62a is shown plated over the lower surface of the substrate 10a and over the tubular insulation 30a covering the transmission line segment. This layer of conductive material is significant in providing shielded or coaxial transmission lines, as described in the above referenced copending application. However, the lower layer of conductive material 62a may be included or omitted without effecting the basic aspects of the present invention.

The layer of conductive material 60a is used in one modification of an optical continuity testing technique. In this technique the layer of conductive material 60a is first plated over the entire surface plane 24a of the substrate 10a and also over the solder bumps 54a. The plated assembly is then heated so that the solder bumps bleed into the layer of conductive material 60a, changing its spectral characteristics at points where the solder bumps 54a are located. The changed spectral characteristics are then observed using one of several possible alternative techniques. An exemplary system for automatically checking the locations of the points of changed spectral characteristics is illustrated in FIG. 35 wherein a light source 64a is shown projecting a light beam through an optical filter 66a onto a plated board assembly 68a constructed according to the present invention. The board 68a is scanned by an optical scanner 70a, the output of which is fed to a pattern comparitor 72a which provides either a match output 74a, indicating that the pattern of spots having altered spectral characteristics corresponds to a desired pattern, or a mismatch output 76a, indicating that the pattern of spots does not correspond to the desired pattern.

The above-described continuity testing system would detect the major discontinuity illustrated in FIG. 37, wherein the displaced conductor end 38a is positioned below the plane 24a. This situation is similar to that illustrated in FIG. 32, with the exception that in FIG. 37 the entire substrate 10a, including the aperture in which the displaced conductor end 38a should have been positioned, had been plated over with the layer of conductive material 60a. Since no solder adheres to the displaced conductor end 38a the spectral characteristics of the conductive layer 60a are not changed at this point. It should be noted that in some cases solder may adhere to the displaced end portion 38a, depending upon the distance of the displacement, the amount of air trapped in the volume of empty insulation 36a and other factors. However if a small amount of solder adheres to the displaced conductor end 38a, this small amount of solder will not come into contact with the layer of conductive material 60a, and therefore the spectral characteristics of the layer of conductive material will not be changed, indicating a discontinuity. On the other hand if a sufficient quantity of solder adheres to the displaced conductor end 38a so that the solder extends upwardly to contact the layer of conductive material 60a, then no continuity will exist, and the same will be indicated by a change in the spectral characteristics of the layer of conductive material 60a.

However even though the above described optical continuity testing technique will detect the above described type of discontinuity, it is clear that substantial difficulties will subsequently occur in the need for repairing the discontinuity. This is particularly true where the layer of conductive material 60a has been plated over the appropriate aperture, rendering this aperture difficult to detect for purposes of repair.

Accordingly attention is now directed to FIG. 38 wherein a bonded wire 80a is illustrated. The bonded wire 80a includes a central conductor 82a surrounded by a layer of insulation 84a. The bonded wire 80a differs from a conventional insulated wire in that a bond 86a exists at all points where the central conductor 82a comes into contact with the layer of insulation 84a. The bond 86a may be formed of a special layer of adhesive material, or may alternatively consist of a direct adhesion of the layer of insulation 84a to the central conductor 82a. The latter type of adhesion can be achieved through various well known heat treating and shrink fitting techniques, provided an appropriate material is selected for the insulation layer 84a. The continuous bond 86a causes the bonded wire 80a to possess a series of highly significant structural properties which are not possessed by conventional insulated wire. First, the central conductor 82a cannot move or slip relative to the layer of insulation 84a. Second, the tensile strength of the central conductor 82a and the layer of insulation 84a are added to one another, while in conventional wire they exist completely independent of one another. This factor is especially significant where extremely fine wires are used, since in such cases the insulation may possess a tensile strength which is equal to or greater than that of the fine wire it surrounds. Since the interconnection system to which the present invention is directed customarily utilizes fine wires, this factor is highly significant. Third, the insulation layer 84a normally has a higher resistance to fatigue and fracture due to continuous flexing than does the central conductor 82a. Thus it is highly unlikely that the conductor and insulation layer 84a will be damaged by continuous or rapid flexing.

From the remarks above it will be apparent that the use of bonded wire provides a substantial improvement in the context of the interconnection system described herein. More particularly, the use of bonded wire would prevent the various types of slippage illustrated in FIGS. 31–33, 36 and 37, and will accordingly eliminate the problems associated with these type of slippage.

Furthermore, the use of bonded wire provides another advantage in that it greatly enhances the reliability of the above described optical continuity testing technique. More particularly, it was pointed out above that the optical continuity testing technique relies upon the assumption that the transmission line conductor is continuous between its end points. As pointed out above bonded wire serves to hold conductor sections together by virtue of the continuous nature of the insulation, and thereby eliminates many discontinuities which are caused by metal fatigue, and the like. In this regard it should be pointed out that if the layer of insulation surrounding the wire is damaged, this fact will be immediately visible preventing the possibility that both the conductor and the insulation are damaged. Furthermore, an entire reel of wire can be tested for continuity before it is cut into appropriate transmission line segments. Thus the possibility that the conductor is initially discontinuous inside its layer of insulation can be eliminated. Accordingly, where insulated wire is used to form the individual transmission line segments, substantially the only type of conductor failure which can occur is that caused by metal fatigue, or some similar effect due to flexing or working of the individual transmission line segments. Since the wire and the conductor are bonded together, kinking and flexing failure of the conductor are readily resisted. As a result, the use of bonded wire greatly improves the reliability of the above described optical continuity testing technique.

This feature is illustrated in FIG. 12 where a bond 86a formed between the layer of insulation 84a and the central conductor 82a retains the central conductor 82a in place with respect to the insulation. Thus the entire central conductor 82a will remain in place during all steps of the assembly, soldering and so forth in preparing a circuit board according to the technique of the present interconnection system. The use of bonded wire therefore greatly enhances the commercial value and industrial acceptability of the interconnection system to which the present invention is related.

The bonded relationship between the insulation and wire conductor provides yet another advantage in preventing the seepage of solutions along the wire conductors and under the insulation layers thereover. In the manufacture of an interconnection system according to the present invention many different chemical solutions are utilized for plating, etching and other operations. Such solutions might pass between the wire conductors and the insulation layers thereover. However, with the insulation bonded to the wire conductors such undesirable seepage is prevented. It is to be understood that the embodiment of FIG. 39 may be provided thereover with plating (not shown) to provide conductive shielding over the conductor 82a and to provide also electrical contact pads adhered to the ends 26a of the conductor 82a, resulting in a shielded conductor interconnection system similar to that illustrated in FIG. 7. In FIG. 40 however a modification of the preferred embodiment of FIG. 39 is illustrated with the cement material 18a and also the conductor insulation 84a in partial receding relationship from the ends 26a of the conductor 82a. This is accomplished by coating the board or substrate 10a with an insulation etchant such as a plastic solvent or acid which etches away only the insulation material of the cement 18a and the insulation 84a without etching back the board substrate 10a or the conductor ends 26a. Accordingly, the conductor 82a and the bottom surface of the substrate 10a is plated with a layer of plating 64a and 66a similar to the plating layers 64 and 66 of FIG. 7. In addition, the plating layers 62a and 60a forming the conductive pads correspond to the conductive pads of FIG. 7 formed by the plating layers 60' and 62'. As shown in FIG. 40 the conductive pads adhere not only to the ends 26a of the conductor 82a but also adhere to a protruding portion of the conductor 82a adjacent the ends 26a. This insures that the conductive pads adhere to a substantial exposed surface area of the conductor 82a. In addition, the recessed or receded configuration of the cement material 18a and the insulation 84a also creates a corresponding recessed configuration in the conductive pads as illustrated generally at 238. Such recessed configuration is particularly suitable for collecting and retaining a flow deposited quantity of solder 240 adhered to the conductive pads. As in the previous embodiments the solder 240 is useful for electrically attaching microelectronic circuit components to the conductive pads.

Figure 42:
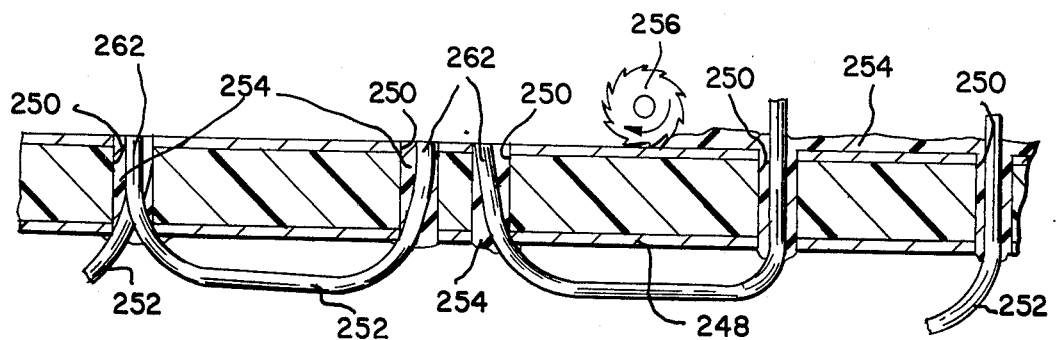
Figure 43:
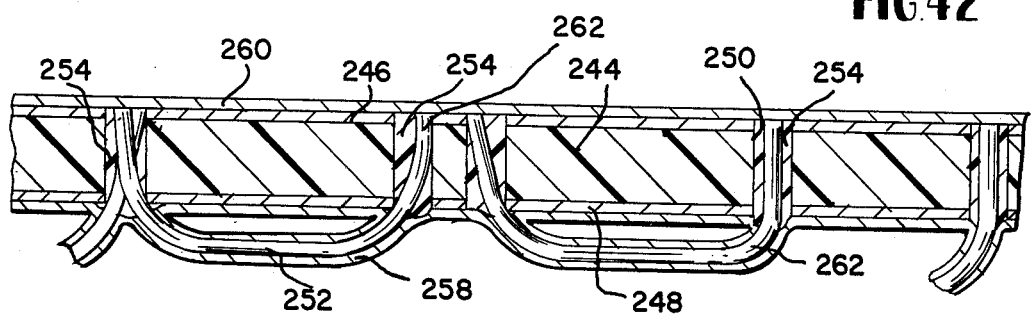
Figure 44:
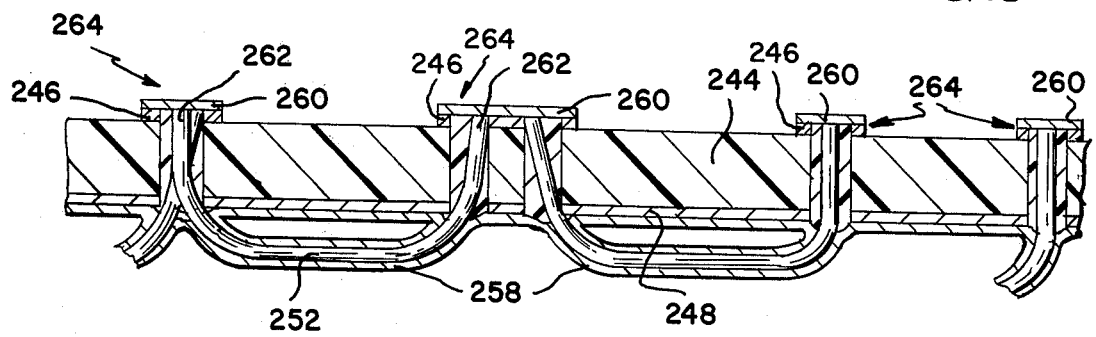

FIGS. 41–45 illustrate another preferred embodiment. Such embodiment is in the form of a substrate 242 having a central dielectric core layer 244 sandwiched between copper or other metallic layers 246 and 248. Such a board may be selectively provided with discretely located apertures 250 therethrough into which lengths of transmission lines 252 may be selectively looped. After the transmission lines are selectively looped the apertures 250 are at least partially filled if not completely with a plastic cement or sealing material such as epoxy 254. The epoxy 254 and the ends of the looped transmission lines 252 are trimmed off flush with the surface of the plating layer 246 for example by a cutting wheel schematically illustrated at 256. The embodiment remaining is particularly characterized in that the plating layer 246 encircles part of the material 254 and also encircles the end portions 262 of the transmission lines 252. An advantage of the present invention is that the plating layers 246 and 248 provide a good base for the shielding plating layer 258 applied by electroless plating for example over the transmission lines 252 and also over the plating layer 248. The plating layer 246 provides a good base over which another plating layer 260 may be applied by electroless plating as shown in FIG. 43. The plating layer 260 thus is adhered to the plating 246 and also to the ends of the conductors of the transmission lines 252. As shown in FIG. 44, the plating layers 260 and 246 may be selectively etched to form electrical contact pads 264, with the plating layer 260 electrically connected to the ends of the conductors of the transmission lines 252 and the plating layer 246 encircling and adhered to the cement material 254 and also the end portions 262 of the transmission lines. The layer 246 thus provides a base to which the plating layer 260 may adhere. The plating layer 260 thus is anchored to the substrate by adherence to the layer 246 and also is adhered to the exposed ends of the conductors of the transmission lines 252 in good electrical contact insured by the positive anchoring of the layer 260 to the layer 246. As an alternative, the plating layer 260 can be eliminated, with solder being applied instead. Solder in molten form may be adhered directly to ends 262 of the wires, with solder also adhering to the pads 246 encircling the wires. Solder will be repelled by the dielectric substrate 244, leaving solder lands adhered only to the wire ends and the pads 246. Microelectronic components then are readily attached by solder reflow to the wire ends and the pads. A modification of the preferred embodiment shown in FIG. 44 is illustrated in FIG. 45, with like numerals of the preferred embodiment illustrating similar parts. An exemplary transmission line 252 is illustrated anchored to the substrate 266 by sealing in cement material 254. As shown the transmission line 252 includes a center conductor 268 covered by a concentric layer of insulation 270. As in the preferred embodiment of FIG. 44, the embodiment of FIG. 45 includes a shielding layer of plating 258 covering and adhered to the layer 248 and the insulation 270. The preferred embodiment also illustrates that a suitable etchant or solvent for the insulation 270 and the sealant and cement material 254 is applied to etch back the material 254 and insulation 270 from the end portions 272 of the conductor 268. Accordingly the end portions 272 protrude from the removed or receded insulation 270 and cement and sealing material 254. Such protruding end portions 272 are thus exposed to a greater degree than in the previous embodiment as shown in FIG. 44 where the transmission line conductors are planed off generally flush with the surface of the plating layer 246, as shown in FIG. 42. Accordingly the exposed end portions 272 may be plated thereover with the plating layer 260, or solder (not shown), either of which, solder or plating layer, will positively adhere to the relatively large surface area of the conductor 268 exposed by receding or removing portions of both the insulation 270 and the cement material 254 from the end portions 272 of the conductor. The plating layer layer 260 or solder also will firmly adhere to the plating layer 246, thereby improving the adherence of the solder or plating layer 260 to the substrate as well as improving the area of contact between the solder or plating layer 260 and the end portions 272 of the conductor. As shown, if the plating layer 260 is utilized, it often includes recesses 274 generally encircling the conductor end portions 272. Such recesses will collect and improve the adherence of a quantity of solder (not shown) which may be applied over the plating layer 260 similar to the quantity of solder 240 of the embodiment illustrated in FIG. 40. If the solder is flow deposited, for example, by the process illustrated diagrammatically in FIG. 34, the solder applied in a liquid state at elevated temperature will tend to anneal the plating layer 260 especially in the vicinity of the end portions 272 of the conductor and thereby improve the mechanical and electrical interface between the conductor and the plating layer 260. This is true of all embodiments wherein solder is applied over a plating layer.

FIG. 46 illustrates another preferred embodiment of the present invention wherein an exemplary transmission line 252 is anchored to and embedded within a cement and sealant material such as epoxy 254 adhered within selectively provided apertures 250 of a substrate 276. As in all other embodiments wherein the transmission lines are insulated conductors, the end portions 278 of the conductors of the transmission line conductors 280 are exposed at the surface of the substrate by grinding operation or planing operation similar to that illustrated in FIG. 42. In the preferred embodiment of FIG. 46 the substrate 276 may be of the type having a metal core 282 sandwiched between dielectric layers 284 which are clad thereover with layers of metal such as copper 286. Such a substrate 276 is commercially available under the tradename "Rexotherm A" from the Brand Rex Division of American Enka Corporation, Willimantic, Conn. In this preferred embodiment, the end portions 278 of the conductors 280 are exposed at the surface of the metal clad layer 286. Both the metal clad layer 286 and the immediately adjacent layer of dielectric 284 encircles the cement material 254 as well as the end portions 278 of the conductor located in the selectively located apertures 250. The embodiment of FIG. 46 may be further modified by applying solder or alternatively pads formed by plating layers as in the previous embodiments. Further modifications include the direct electrical attachment of microelectronic circuit components directly to the end portions 278 of the conductor 280 by solder reflow, or providing solder over the pads adhered to the end portions 278 of the conductor. In addition the preferred embodiment of FIG. 46 can be modified by etching back or receding the cement material 254 and the insulation 281 on the conductor 280, for example as taught in the previous embodiment illustrated in FIG. 45. The solder or plating layer may then be provided over the end portions 278 of the conductor which will then have a relatively large surface area exposed by the receding or etching back operation applied to the cement material and the insulation 281.

It is intended that each of the preferred embodiments of the present invention may utilize substrates predrilled with apertures some of which receive wire ends and those which do not receive wire ends being filled with the sealant and filler cement material. Each embodiment may also use substrates which are first only selectively drilled to provide a limited number of apertures which each is to receive at least one wire end. This prevents having to drill any unnecessary apertures in the substrate.

Although preferred embodiments and modifications of the present invention have been shown and described in detail, other embodiments and modifications of the present invention are intended to be covered in the spirit and scope of the appended claims, wherein:

We claim:
1. A method for fabricating an interconnection system of insulation covered wire anchored to a substrate, comprising the steps of:
   bridging loops of insulation covered wire across a first surface of a substrate,
   inserting portions of each of said loops into corresponding openings through said substrate,
   projecting said loop portions in said openings at a second surface of said substrate,
   sealing and electrically isolating said first and second surfaces of said substrate one from the other by placing solidifiable material within said openings,
   bonding solidifiable material in each of said openings in encirclement around the insulation of said loop portions,
   bonding solidifiable material to said substrate and to the insulation covering said loop portions, thereby anchoring said loop portions to said substrate,
   trimming said loop portions adjacent said second surface to provide exposed wire ends encircled by said insulation and said solidifiable material, whereby said wire ends provide energizable signal energy surfaces.

2. A method as recited in claim 1, wherein the step of inserting portions of each of said loops further comprises the steps of:
   providing said openings in said substrate one at a time, and
   inserting at least one of said loop portions into a corresponding opening as it is provided in said substrate.

3. The method as recited in claim 1 and further including the step of:
   providing all of said openings in said substrate prior to the step of inserting said portions of each of said loops into said openings.

4. A method for fabricating an interconnection system, comprising the steps of:
   providing a plurality of openings in a substrate, which openings extend from a first surface of the substrate to a second surface thereof,
   inserting the corresponding ends of loops of signal carrying transmission lines into said openings while extending the middle portions of said loops across said first surface of said substrate,
   encircling said ends of loops with a solidifiable non-signal-permeable material placed within said openings,
   sealably bonding said solidifiable material to said ends of loops and to said substrate, thereby anchoring said ends of loops to said substrate,
   sealing said openings with said solidifiable material placed within said openings to seal said substrate first and second surfaces one from the other,
   trimming said ends of loops adjacent said substrate second surface to expose transverse end areas of said transmission lines sealably encircled by said solidifiable material.

5. The method as recited in claim 4, and further including the step of:

adhering metal shielding over said substrate first surface and over the middle portions of said loops extending across said substrate first surface.

6. The method as recited in claim 5 and further including the step of:
connecting metal pads to said exposed transverse end areas of said transmission lines.

7. The method as recited in claim 4, wherein said transmission lines are insulation covered wires and said step of sealably bonding said solidifiable material to said ends of loops further includes the step of:
bonding said solidifiable material to said insulation covering said ends of loops, and
said step of trimming said ends of loops further includes the step of: exposing transverse end areas of said wires covered with said insulation which is in turn sealably encircled by said solidifiable material.

8. The method as recited in claim 4, wherein, said transmission lines are optical conductors and further including the step of:
covering said loop middle portions and said substrate first surface with optically reflecting material.

9. A method for fabricating an interconnection system, comprising the steps of:
providing selected openings through a substrate,
bridging loops of strand material across a first surface of said substrate,
inserting end portions of each said loops into corresponding openings in said substrate,
sealing said openings by placing solidifiable material therein,
encircling said end portions of said loops with said solidifiable material,
covering the remaining portions of said loops of strand material with a solid material,
removing said loops of strand material from said substrate and said solid material leaving conduits through said solid material and through said solidifiable material, which conduits extend to a second surface of said substrate.

10. The method as recited in claim 9 and further including the step of:
removing said solidifiable material from said openings, thereby leaving conduits through said solid material and opening into said openings.

11. A method for providing a point-to-point transmission line interconnection system comprising the steps of:
connecting lengths of strand material between discrete point-to-point locations on a substrate,
anchoring said lengths of strand material to said substrate,
providing metallized material over said lengths of strand material, and
removing said strand material from said metallized material, said metallized material providing hollow conduits as said lengths of transmission lines.

12. The method as recited in claim 1, and further including the step of:
recessing selected portions of said substrate after trimming said loop portions to protrude said wire ends and said energizable signal energy surfaces from said substrate.

13. A method for fabricating a point-to-point transmission line interconnection system comprising the steps of:
connecting the end portions of loops of transmission lines between discrete point-to-point locations on a fixture,
encapsulating the middle portions of the loops with a first solidifiable material,
removing said fixture thereby exposing the loop end portions protruding from said first solidifiable material,
applying a second solidifiable material against said first solidifiable material to form a substrate sealably encircling said exposed loop end portions,
trimming said loop end portions adjacent a surface of said substrate to provide discrete energizable signal energy surfaces on each of said loop end portions, and
removing said first solidifiable material from the middle portions of said loops of transmission lines.

14. The method as recited in claim 7, and further including the step of:
adhering solder droplets to said discrete energizable signal energy surfaces.

* * * * *